United States Patent
Sugimoto et al.

(10) Patent No.: US 7,339,260 B2
(45) Date of Patent: Mar. 4, 2008

(54) WIRING BOARD PROVIDING IMPEDANCE MATCHING

(75) Inventors: Yasuhiro Sugimoto, Konan (JP); Kazunaga Higo, Inuyama (JP); Kazuhiro Suzuki, Kasugai (JP)

(73) Assignee: NGK Spark Plug Co., Ltd., Aichi (JP)

( * ) Notice: Subject to any disclaimer, the term of this patent is extended or adjusted under 35 U.S.C. 154(b) by 221 days.

(21) Appl. No.: 10/927,134

(22) Filed: Aug. 27, 2004

(65) Prior Publication Data

US 2006/0043572 A1   Mar. 2, 2006

(51) Int. Cl.
*H01L 23/12* (2006.01)
*H01L 23/02* (2006.01)
*H05K 3/46* (2006.01)
*H05K 1/02* (2006.01)
*H01H 29/40* (2006.01)

(52) U.S. Cl. .............. 257/668; 257/E23.062; 257/E23.063; 257/E23.067; 257/E23.079; 257/E23.07; 257/774; 257/700; 257/698; 257/701; 257/702; 257/758; 361/316; 361/760; 361/761; 174/260

(58) Field of Classification Search ........ 257/E23.063, 257/E23.067, E23.079, E23.07, E23.062, 257/700, 698, 774, 678, 668; 361/316, 760, 361/761; 174/260
See application file for complete search history.

(56) References Cited

U.S. PATENT DOCUMENTS 6,178,093 B1 *   1/2001   Bhatt et al. .................. 361/795

2005/0211561 A1 *   9/2005   En ............................. 205/125
2005/0218502 A1 * 10/2005   Sunohara et al. ........... 257/700
2006/0000877 A1 *   1/2006   Wang ..................... 228/180.22

FOREIGN PATENT DOCUMENTS

| JP | 11176984 A | 7/1999 |
|---|---|---|
| JP | 2000077808 A | 3/2000 |
| JP | 2001-160598 | 6/2001 |
| JP | 2004-158553 | 6/2004 |

* cited by examiner

*Primary Examiner*—Alexander Oscar Williams
(74) *Attorney, Agent, or Firm*—Sughrue Mion, PLLC

(57) ABSTRACT

A wiring board comprising: a plate core having a first main surface and a second main surface; conductor layers including a conductor line; dielectric layers laminated alternately with said conductor layers on at least one of said first and second main surfaces; via conductors as defined herein; a signal through-hole as defined herein; a signal through-hole conductor as defined herein; a first path end pad as defined herein; a second path end pad as defined herein; a shield through-hole as defined herein; and a shield through-hole conductor as defined herein; wherein: a signal transmission path is formed as defined herein; at least one of said conductor layers is disposed on each of said first and second main surface sides; said surface conductor on said first main surface side and said conductor line form a strip line, a microstrip line, or a coplanar waveguide with constant characteristic impedance Z0; an inner surface of said shield through-hole is covered with said shield through-hole conductor; and an interaxis distance between said signal through-hole conductor and said shield through-hole conductor is adjusted as defined herein.

18 Claims, 15 Drawing Sheets

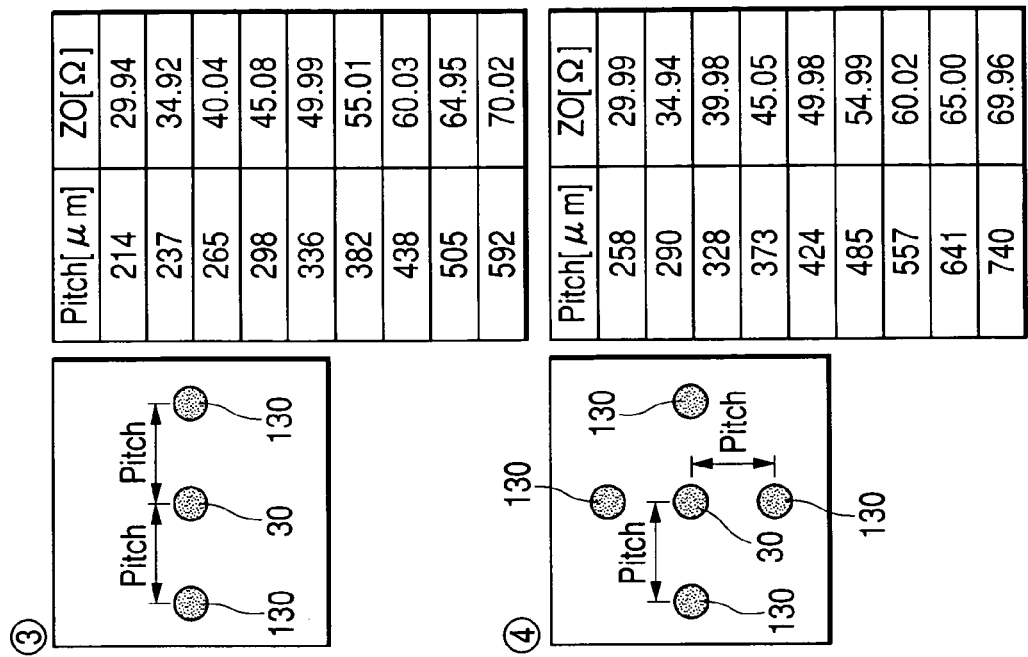
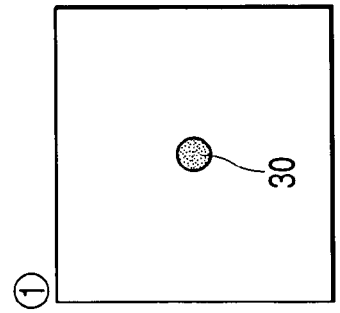
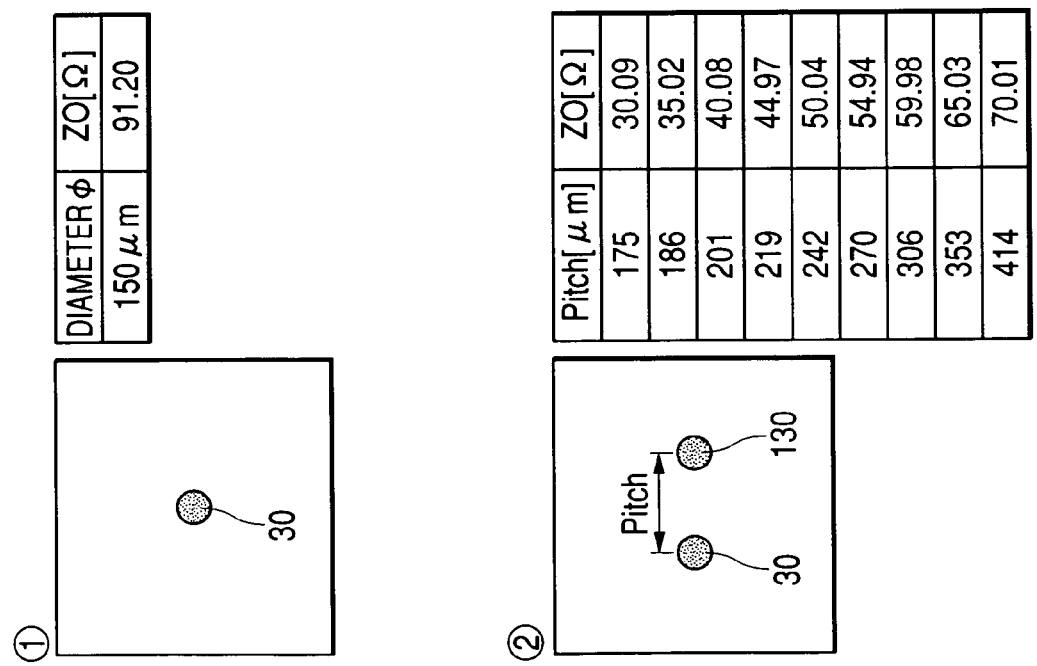
FIG. 17

WIRING BOARD PROVIDING IMPEDANCE MATCHING

FIELD OF THE INVENTION

The present invention relates to a wiring board.

BACKGROUND OF THE INVENTION

As a wiring board on which semiconductor components such as LSIs, ICs, etc. are mounted or in which various thick printed elements are built, a multilayer wiring board in which resin dielectric layers and metal conductor layers are laminated alternately on opposite surfaces of a plate core formed from a glass reinforced resin or the like has been used. The metal conductor layers contain a wiring portion for signal transmission. In recent years, boards used in high clock frequency computer equipment, optical communication equipment, etc., have supported signal frequencies in a high frequency band beyond 1 GHz. In the wiring portion of such a board, a high frequency shield line such as a strip line or a microstrip line has been used.

Matching characteristic impedance with a rated value (50 Ω) is performed in a well-worn manner for enhancing the signal transmission efficiency in the wiring portion in the multilayer wiring board. The strip line or microstrip line can be designed to have a transmission line structure with rated characteristic impedance on the basis of a distributed parameter circuit theory using an interval between each surface conductor (ground layer or power supply layer) and the line opposite to each other, a line width, a dielectric constant of dielectric between the surface conductor and the line, etc. as parameters.

A signal transmission path in the multilayer wiring board is formed to range from a pad (e.g. a solder land for making a flip chip connection with a semiconductor component) formed on a first main surface side of the plate core to a pad (e.g. a BGA or PGA pad for connecting with a mother board) formed on a second main surface side of the plate core. In this case, as described above, desired characteristic impedance of the conductor line portion drawn around in the conductor layer can be achieved comparatively easily by a well-known theory design technique in accordance with the form of the high frequency shield line. However, in consideration of installation of the board into a real product, the characteristic impedance of the whole multilayer wiring board, that is, the whole signal transmission path between the pads is required to be matched with the rated value.

In addition to the line portion having theoretically rated characteristic impedance (hereinafter referred to as "standard impedance portion") such as a strip line or a microstrip line, many portions having characteristic impedance other than the rated value (hereinafter referred to as "nonstandard impedance portions") are mixed on the signal transmission path. Examples of the nonstandard impedance portions include via conductors, through-hole conductor portions penetrating the plate core, pads disposed on the surfaces of the board, etc. Each of the nonstandard impedance portions is a factor to cause impedance mismatching. In this case, it is conceived that impedance matching can be attained by changing the line width of the strip line or the microstrip line constituting the standard impedance portion, a thickness of each dielectric layer, etc. This is regarded as a solution in which the problem caused by the nonstandard impedance portions is loaded on the so-called standard impedance portion side. It is highly likely that even the design of the whole board will be affected by the solution. If possible, it is desired that such a solution is not used.

The nonstandard impedance portion, for example, a via or a through-hole conductor, does not include a surface conductor (for ground or power supply) which has to be essentially included in any standard impedance portion. Therefore, there is a tendency that the nonstandard impedance portion is lower in capacitance but higher in reactance than the standard impedance portion. On the other hand, high parasitic capacitance is formed between each conductor pad and a surface conductor disposed around the conductor pad or disposed oppositely to the conductor pad through a dielectric layer. Therefore, there is a tendency that the reactance is decreased conversely. When coupling is formed between the capacitance and inductance, there appears a zero point or an extreme in the frequency characteristic of the impedance, having significant influence on impedance matching in a desired frequency band.

For example, according to Japanese Patent Laid-Open No. 2001-160598, a method for achieving impedance matching in a board including an electrode pad has been proposed as follows. That is, a condition $0 < d \leq w$ is set in which a diameter of an electrode pad is w and an in-plane distance between an inner edge of a via opening and an outer edge of the electrode pad is d, the via opening being formed in a position just under the electrode pad in surface conductor layers opposite to each other with a dielectric layer interposed therebetween. In this manner, parasitic capacitance formed between the electrode pad and each of the surface conductor layers is reduced on a large scale, so that impedance mismatching due to formation of the electrode pad can be cancelled.

SUMMARY OF THE INVENTION

However, in consideration of impedance matching of the signal transmission path including the nonstandard impedance portions as described above, it must be noted that each member such as a via, a signal through-hole conductor, a conductor pad, etc. changes a reactance term (an imaginary part of impedance) of the transmission path. That is, when the nonstandard impedance portions are formed, a differential term with respect to an expected impedance matching state appears as the reactance term depending on the signal frequency, so that there occurs a large change in frequency characteristic of the impedance. Particularly, when a large number of nonstandard impedance portions different in contribution to an inductance term or a capacitance term are included, or when parasitic capacitance or parasitic inductance (generically referred to as "parasitic reactance") incapable of being grasped accurately structurally is generated in addition to the nonstandard impedance portions, coupling behavior between the capacitance and the inductance is complicated so that it is in fact impossible to theoretically trace the frequency characteristic of the impedance.

Accordingly, a technique as in Japanese Patent Laid-Open No. 2001-160598 in which an individual nonstandard impedance portion such as the electrode pad is analyzed for symptomatically reducing the influence of the reactance term, causes such a failure that impedance matching of the pad-to-pad transmission path as a whole cannot be achieved at a desired signal frequency. Particularly, deterioration in transmission efficiency due to impedance mismatching is conspicuous in a high frequency band not lower than 1 GHz in which the influence of the parasitic capacitance becomes significant.

An object of the invention is to provide a wiring board in which impedance matching of a whole pad-to-pad signal transmission path laid between the front and rear surfaces of the board through a conductor line, a signal through-hole conductor formed in a plate core and vias can be achieved easily at a desired signal frequency.

In order to solve the problem, according to a first configuration of the invention, there is provided a wiring board including: a plate core (a core in the form of a plate) having a first main surface and a second main surface; conductor layers including a conductor line; dielectric layers laminated alternately with the conductor layers on at least one of the first and second main surfaces of the plate core; via conductors formed to penetrate the dielectric layers; a signal through-hole made to penetrate the plate core in a plate thickness direction; a signal through-hole conductor with which an inner surface of the signal through-hole is covered; a first path end pad provided on a first main surface side of the plate core; a second path end pad formed on a second main surface side of the plate core; a shield through-hole formed to penetrate the plate core in the plate thickness direction and located in a position adjacent to the signal through-hole in the plate core; and a shield through-hole conductor connected to at least one of the surface conductor on the first main surface side and the surface conductor on the second main surface side in the plate core; wherein: a signal transmission path is formed to range from the first path end pad to the second path end pad and to include the conductor line, the via conductors, and the signal through-hole conductor; at least one of the conductor layers is disposed on each of the first and second main surface sides of the plate core so as to form a surface conductor serving as a power supply layer or a ground layer; the surface conductor on the first main surface side and the conductor line form a strip line, a microstrip line, or a coplanar waveguide with constant characteristic impedance Z0; an inner surface of the shield through-hole is covered with the shield through-hole conductor in order to shield a high-frequency signal transmitted through the signal through-hole conductor; and an interaxis distance between the signal through-hole conductor and the shield through-hole conductor is adjusted so that characteristic impedance Z0' of a shield transmission path structure formed by the signal through-hole conductor and the shield through-hole conductor is in the range of Z0±20 Ω.

In the aforementioned configuration, the shield through-hole conductor is formed in a position adjacent to the signal through-hole conductor in the plate core. Further, the interaxis distance between the signal through-hole conductor and the shield through-hole conductor is adjusted so that the characteristic impedance Z0' of the shield transmission path structure (hereinafter referred to as "through-hole transmission path structure") formed by the signal through-hole conductor and the shield through-hole conductor is in the range of Z0±20 Ω where Z0 designates the characteristic impedance of the strip line, the microstrip line or the coplanar waveguide (standard impedance portion) constituting a main portion of the signal transmission path from the first path end pad to the second path end pad. Parasitic capacitance between the signal through-hole conductor and the shield through-hole conductor varies largely in accordance with the adjustment of the interaxis distance, so that the characteristic impedance of the whole signal transmission path can be adjusted in a comparatively wide range using the width of the change of the parasitic capacitance as an adjustment margin. The signal transmission path from the first path end pad to the second path end pad includes a large number of nonstandard impedance portions causing impedance mismatching, such as the vias, the signal through-hole conductor, the conductor pads, etc. Nevertheless the characteristic impedance of the signal transmission path can be adjusted easily to be matched with its rated value and the influence of the parasitic capacitance or parasitic inductance incapable of being grasped structurally accurately can be also reduced.

Further, according to a second configuration of the invention, there is provided a wiring board including: a plate core having a first main surface and a second main surface; conductor layers including a conductor line; dielectric layers laminated alternately with the conductor layers on at least one of the first and second main surfaces of the plate core; via conductors formed to penetrate the dielectric layers; a signal through-hole made to penetrate the plate core in a plate thickness direction; a signal through-hole conductor with which an inner surface of the signal through-hole is covered; a first path end pad provided on a first main surface side of the plate core; a second path end pad formed on a second main surface side of the plate core; a shield through-hole formed to penetrate the plate core in the plate thickness direction and located in a position adjacent to the signal through-hole in the plate core; and a shield through-hole conductor connected to at least one of the surface conductor on the first main surface side and the surface conductor on the second main surface side in the plate core; wherein: a signal transmission path is formed to range from the first path end pad to the second path end pad and to include the conductor line, the via conductors, and the signal through-hole conductor; at least one of the conductor layers is disposed on each of the first and second main surface sides of the plate core so as to form a surface conductor serving as a power supply layer or a ground layer; the surface conductor on the first main surface side and the conductor line form a strip line, a microstrip line, or a coplanar waveguide with constant characteristic impedance Z0; an inner surface of the shield through-hole is covered with the shield through-hole conductor in order to shield a high-frequency signal transmitted through the signal through-hole conductor; and an outer diameter of each of the signal through-hole conductor and the shield through-hole conductor is adjusted so that characteristic impedance Z0' of a shield transmission path structure formed by the signal through-hole conductor and the shield through-hole conductor is in the range of Z0±20 Ω.

That is, in the second configuration of the invention, parasitic capacitance between the signal through-hole conductor and the shield through-hole conductor varies largely also in accordance with the adjustment of the conductor outer diameter, so that characteristic impedance of the whole signal transmission path can be adjusted in a comparatively wide range using the width of the change of the parasitic capacitance as an adjustment margin. Accordingly, similarly to the first configuration of the invention, the characteristic impedance of the signal transmission path can be adjusted easily to be matched with its rated value and the influence of the parasitic capacitance or parasitic inductance incapable of being grasped structurally accurately can be reduced. It is a matter of course that both the interaxis distance between the signal through-hole conductor and the shield through-hole conductor and the outer diameter of each of the signal through-hole conductor and the shield through-hole conductor can be adjusted so that the degree of freedom in adjustment of the characteristic impedance of the signal transmission path can be more enhanced.

In order to reduce transmission loss in a high frequency circuit to thereby achieve efficient signal transmission, it is essential to homogenize an impedance structure of the signal transmission path in the transmission direction to the utmost, that is, it is essential to use a structure with constant characteristic impedance Z0, so as to prevent loss due to unnecessary reflection, radiation, etc. In order to achieve the object in the wiring board structure in which conductor layers and dielectric layers are laminated alternately, it is taken for granted that a strip line, a microstrip line or a coplanar waveguide is used as the transmission line structure with constant characteristic impedance Z0 except an exceptional portion for some reason on design or the like.

The signal through-hole conductor is often larger in size than any other nonstandard impedance portion. Thus, the signal through-hole conductor has significant influence on impedance mismatching of the whole signal transmission path. When one single signal through-hole conductor is provided alone, the influence of the signal through-hole conductor can be regarded as reduction of parasitic capacitance based on absence of a shield conductor, and hence as increase of a reactance term in the characteristic impedance. Accordingly, when a shield through-hole conductor substantially equivalent in dimensions is provided adjacently to the signal through-hole conductor, increase of the reactance term can be suppressed effectively so that loss due to signal leakage etc. can be reduced on a large scale. However, the conductor area is increased. Accordingly, when the interaxis distance between the two through-hole conductors is reduced excessively or the outer diameter of each of the conductors is increased excessively (in the case where the outer diameter of each of the conductors is increased, even if the interaxis distance between the through holes is fixed, a distance between the outer circumferential surfaces of the through holes is reduced so that the parasitic capacitance is increased), the parasitic capacitance in the through-hole transmission path structure is increased too much. As a result, the reactance term is shifted to be insufficient to thereby result in impedance mismatching. In other words, the interaxis distance between the two through-hole conductors or the conductor outer diameter has a considerably large effect on the change in the characteristic impedance of the whole signal transmission path. Accordingly, when the characteristic impedance of the through-hole transmission path structure is excessively far from the characteristic impedance Z0 of the standard impedance portion which is a reference of the matching value, the impedance matching of the whole signal transmission path is no longer possible. In order to prevent such a failure, the interaxis distance or the conductor outer diameter is adjusted so that the characteristic impedance Z0' of the through-hole transmission path structure is in the range of Z0±20 Ω.

Incidentally, as a reference technique, Japanese Patent Laid-Open No. 2004-158553 has disclosed a multilayer board in which an interval between differential lines constituted by a pair of signal transmission lines is made consistent with an interval between a pair of signal vias electrically connected to the lines so that impedance of the differential lines is matched with impedance of the pair of signal vias. In the multilayer board according to Japanese Patent Laid-Open No. 2004-158553, however, only impedance matching in view of the differential lines and the pair of signal vias corresponding thereto is taken into consideration. This fact is apparent from Expression (1) (paragraph [0025]) of Japanese Patent Laid-Open No. 2004-158553 in which an expression of differential impedance $Z_{dif}$ of the pair of signal vias includes a pitch between the signal vias and the diameter of each signal via simply without any consideration given to an interaxis distance between each signal via and a corresponding ground via or the diameter of the ground via. Accordingly, in the wiring board, characteristic impedance of the differential line portions is very high to be about 100 Ω because there is no consideration about the fact that the differential line portions coupled with the GND layers (or power supply layers) form a standard impedance portion. Japanese Patent Laid-Open No. 2004-158553 says in the paragraph [0024] "Here, it is assumed that GND vias 6 gives little influence on the value of the differential impedance $Z_{dif}$ of a transmission section formed by signal vias 5, that is, it is assumed that an interval between each GND via 6 and a corresponding signal via 5 is sufficiently large in comparison with a pitch $P_v$ of the signal vias 5." Therefore, there is no idea that the signal vias are coupled with the GND vias or power supply vias for the purpose of impedance reduction. Accordingly, in Japanese Patent Laid-Open No. 2004-158553, there is no description or no suggestion about such technical contents that an interval between each GND via constituting a nonstandard impedance portion and a corresponding signal via is made shorter, and further, the interval between the GND via and the signal via or the diameter of each of the GND via and the signal via is adjusted desirably so as to match the nonstandard impedance portions with the standard impedance portion (e.g. Z0=50 Ω) (Japanese Patent Laid-Open No. 2004-158553 has only disclosed that the interval between the differential lines and the interval between the pair of signal vias are made consistent with each other).

Incidentally, a plurality of shield through-hole conductors may be disposed around the signal through-hole conductor. Accordingly, the shield effect on the signal through-hole conductor is enhanced so that transmission loss can be suppressed more effectively.

The wiring board according to the invention can be adapted so that a fourth conductor layer including a third surface conductor, a third dielectric layer, a fifth conductor layer including a fourth surface conductor, and a fourth dielectric layer are laminated successively on the second main surface of the plate core in order of increasing distance from the plate core; a through-hole opening is formed in the fourth conductor layer and in a position of the third surface conductor corresponding to the signal through-hole conductor, and a through-hole pad electrically connected to the signal through-hole conductor is disposed in the inside of the through-hole opening so as to form an annular gap between the through-hole pad and the through-hole opening; a via opening is formed in the fifth conductor layer and in a position of the fourth surface conductor corresponding to the signal through-hole conductor, and third signal via conductors formed to penetrate the third dielectric layer and the fourth dielectric layer while connected to the through-hole pad are disposed in the inside of the via opening; and the third surface conductor and the fourth surface conductor form ground conductors or power supply conductors, and a shield via conductor for shielding a high-frequency signal transmitted through the third signal via conductors is provided in the third dielectric layer so as to be connected to at least one of the third surface conductor and the fourth surface conductor.

According to a third configuration of the invention, there is provided a wiring board including: a plate core having a first main surface and a second main surface; conductor layers including a conductor line; dielectric layers laminated alternately with the conductor layers on each of the first and second main surfaces of the plate core; via conductors formed to penetrate the dielectric layers; a signal through-hole made to penetrate the plate core in a plate thickness direction; a signal through-hole conductor with which an inner surface of the signal through-hole is covered; a first path end pad provided on a first main surface side of the plate core; and a second path end pad formed on a second main surface side of the plate core; wherein: a signal transmission path is formed to range from the first path end pad to the second path end pad and to include the conductor line, the via conductors, and the signal through-hole conductor; a fourth conductor layer including a third surface conductor, a third dielectric layer, a fifth conductor layer including a fourth surface conductor, and a fourth dielectric layer are laminated successively on the second main surface of the plate core in order of increasing distance from the plate core; a through-hole opening is formed in the fourth conductor layer and in a position of the third surface conductor corresponding to the signal through-hole conductor, and a through-hole pad electrically connected to the signal through-hole conductor is disposed in the inside of the through-hole opening so as to form an annular gap between the through-hole pad and the through-hole opening; a via opening is formed in the fifth conductor layer and in a position of the fourth surface conductor corresponding to the signal through-hole conductor, and third signal via conductors formed to penetrate the third dielectric layer and the fourth dielectric layer while connected to the through-hole pad are disposed in the inside of the via opening; and the third surface conductor and the fourth surface conductor form ground conductors or power supply conductors, and a shield via conductor for shielding a high-frequency signal transmitted through the third signal via conductors is provided in the third dielectric layer so as to be connected to at least one of the third surface conductor and the fourth surface conductor.

In the aforementioned configuration, the shield via conductor is disposed in a position adjacent to the third signal via conductors provided as a nonstandard impedance portion for connecting the second path end pad to the signal through-hole conductor. Thus, the shield via conductor also acts advantageously to achieve impedance matching of the whole signal transmission path, in addition that the shield effect on the third signal via conductors can be enhanced so that transmission loss can be suppressed.

The shield via conductor can be connected to the fourth surface conductor in an inner circumferential edge portion of the via opening. In this manner, the shield via conductor can be made closer to the signal through-hole conductor so that shortage of parasitic capacitance of the third signal via conductors can be compensated more effectively. A plurality of shield via conductors may be disposed around the third signal via conductors. Thus, the shield effect on the third signal via conductors can be enhanced so that transmission loss can be suppressed more effectively.

Description will be made below that requirements that can be further attached to the wiring board according to the invention.

Impedance adjustment openings for adjusting the characteristic impedance of the signal transmission path can be formed in the surface conductors and in positions facing the signal transmission path through the dielectric layers. When parts of the surface conductors opposite to the signal transmission path are removed in the form of openings, capacitance generated between the signal transmission path and each surface conductor is reduced in the portion where the surface conductor is removed. Accordingly, when the aforementioned impedance adjustment openings are provided, an adjustment margin of the reactance term in the impedance of the signal transmission path can be secured so that the characteristic impedance of the signal transmission path in a desired frequency band can be adjusted easily to be matched with its rated value. Change behavior of L/C coupling between the signal transmission path and each surface conductor when the corresponding impedance adjustment opening is changed is largely different from change behavior of L/C coupling when the interaxis distance between the signal through-hole conductor and the shield through-hole conductor in the through-hole transmission path structure or the conductor outer diameter is changed. Thus, the frequency band where the impedance adjustment effect appears due to the impedance adjustment openings differs that due to the through-hole transmission path structure. Accordingly, in combination of the impedance adjustment openings and the through-hole transmission path structure, an effect of greatly increasing the degree of freedom in adjustment can be obtained newly. That is, in addition that impedance can be adjusted in a boarder frequency band, impedance can be adjusted in a frequency band selected desirably.

Specifically, the wiring board according to the invention may be adapted so that a first conductor layer including a first surface conductor, a first dielectric layer, a second conductor layer including a conductor line, and a second dielectric layer are laminated successively on the first main surface of the plate core in order of increasing distance from the plate core; the signal through-hole is formed to penetrate the plate core in the plate thickness direction and in a position opposite to a first end portion of the conductor line, and a first main surface side end portion of the signal through-hole conductor with which the inner surface of the signal through-hole is covered is connected to the first end portion of the conductor line through a first signal via conductor formed to penetrate the first dielectric layer, while the second path end pad connected to a second main surface side end portion of the signal through-hole conductor is disposed on the second main surface side of the plate core; a second signal via conductor formed to penetrate the second dielectric layer is connected to a second end portion of the conductor line, and the first path end pad electrically connected to the second signal via conductor is disposed on the second dielectric layer; and a first impedance adjustment opening for adjusting characteristic impedance of the signal transmission path from the first path end pad to the second path end pad is formed in the first surface conductor and in a position opposite to the second end portion of the conductor line.

In the configuration, when the via for connecting the second end portion of the conductor line to the first path end pad is used as the second signal via, the first impedance adjustment opening is provided oppositely to the second end portion of the conductor line and in the first surface conductor located on the opposite side to the second signal via with respect to the conductor line. The portion of the first surface conductor opposite to the conductor line, together with the line conductor, essentially forms a strip line or a microstrip line (standard impedance portion) having rated characteristic impedance. On the other hand, comparatively high parasitic capacitance is generated also between the portion of the first surface conductor and the first path end pad in spite of two dielectric layers interposed therebetween. As a result, when an opening is formed in the portion of the first surface conductor, the parasitic capacitance becomes a so-called adjustment margin such that the characteristic impedance of the whole signal transmission path can be adjusted in a comparatively wide range. The signal transmission path from the first path end pad to the second path end pad includes a large number of nonstandard impedance portions causing impedance mismatching, such as the vias, the signal through-hole conductor, the conductor pads, etc. Nevertheless the characteristic impedance of the signal transmission path can be adjusted easily to be matched with its rated value due to the adjustment of the size of the opening while the influence of the parasitic capacitance or parasitic inductance incapable of being grasped accurately structurally can be reduced.

Further, the wiring board according to the invention may be adapted so that a first conductor layer including a first surface conductor, a first dielectric layer, a second conductor layer including a conductor line, a second dielectric layer, and a third conductor layer including a second surface conductor are laminated successively on the first main surface of the plate core in order of increasing distance from the plate core; the conductor line is interposed between the first surface conductor and the second surface conductor so as to form a strip line; the signal through-hole is formed to penetrate the plate core in the plate thickness direction and in a position opposite to a first end portion of the conductor line, and a first main surface side end portion of the signal through-hole conductor with which the inner surface of the signal through-hole is covered is connected to the first end portion of the conductor line through a first signal via conductor formed to penetrate the first dielectric layer, while the second path end pad connected to a second main surface side end portion of the signal through-hole conductor is disposed on the second main surface side of the plate core; and a second impedance adjustment opening for adjusting characteristic impedance of the signal transmission path is provided in a position opposite to the first end portion of the conductor line in the second surface conductor.

In the configuration, when the via for connecting the first end portion of the conductor line to the signal through-hole conductor is used as the first signal via, the second impedance adjustment opening is provided opposite to the first end portion of the conductor line and in the second surface conductor located on the opposite side to the first signal via with respect to the conductor line. The portion of the second surface conductor opposite to the conductor line, together with the line conductor, essentially forms a strip line (standard impedance portion) having rated characteristic impedance. Due to the second impedance adjustment opening formed in the portion of the second surface conductor, a reactance term in the impedance of the signal transmission path can be used as an adjustment margin so that the characteristic impedance of the signal transmission path in a desired frequency band can be adjusted easily to be matched with its rated value.

The first impedance adjustment opening and the second impedance adjustment opening can be provided individually or in combination. Thus, the adjustment margin of the reactance term in the impedance of the signal transmission path can be more enlarged so that the characteristic impedance of the signal transmission path in a desired frequency band can be adjusted more easily to be matched with its rated value. The signal transmission path side conductor opposite to the first impedance adjustment opening is different in shape and area from the signal transmission path side conductor opposite to the second impedance adjustment opening (e.g. the latter case mainly includes the transmission line and the via conductor, while the former includes the first path end pad having a slightly larger area in addition thereto). Therefore, the distribution of the conductor side inductance to be coupled with the parasitic capacitance near the first impedance adjustment opening is different from the distribution of the conductor side inductance to be coupled with the parasitic capacitance near the second impedance adjustment opening. Accordingly, change behavior of L/C coupling when the size of the first impedance adjustment opening is changed is different remarkably from that when the size of the second impedance adjustment opening is changed. Accordingly, the impedance adjustment openings have different frequency bands in which the impedance adjustment effect appears due to adjustment of the inner diameters thereof. Accordingly, as described above, when a plurality of kinds of impedance adjustment openings different in terms of at least one of the shape of the signal transmission path side conductor generating parasitic capacitance with a corresponding surface conductor where the opening is formed, the size of the signal transmission path side conductor, and the relative position relation between the signal transmission path side conductor and the surface conductor are used in combination, the effect of enhancing the degree of freedom in adjustment is more conspicuous.

Assume that the inner diameter of the first impedance adjustment opening is d1 and an outer diameter of the first path end pad is d2. Then, preferably, the inner diameter d1 of the first impedance adjustment opening is set to be in the range of d1<d2. The setting is made thus for the following reason. When the first path end pad and the first impedance adjustment opening are made equal in size (that is, d1=d2), a reactance adjustment margin due to parasitic capacitance between the first surface conductor and the first path end pad is almost cancelled so that the characteristic impedance adjustment effect on the signal transmission path reaches the peak. On the other hand, when the first impedance adjustment opening is enlarged in the condition d1>d2, the surface conductor portion opposite to the line conductor is insufficient so that loss due to signal leakage is conspicuous.

Incidentally, the inner diameter of the second impedance adjustment opening is preferably set to prevent conspicuous loss due to signal leakage because the first signal via accompanied by no shield conductor is formed there. For example, an inner diameter d7 of the second impedance adjustment opening is preferably adjusted to be in the range of d7<5 w where w designates the width of the line conductor.

The invention particularly conspicuously exerts an impedance matching improvement effect and hence a transmission efficiency improvement effect all over the signal transmission path particularly in a high frequency band not lower than 1 GHz (e.g. up to 10 GHz, particularly up to 5 GHz) in which the influence of parasitic capacitance becomes particularly large.

Next, the wiring board according to the invention can be adapted so that a fourth conductor layer including a third surface conductor, a third dielectric layer, a fifth conductor layer including a fourth surface conductor, a fourth dielectric layer and a sixth conductor layer including a fifth surface conductor are laminated successively on the second main surface of the plate core in order of increasing distance from the plate core; a through-hole opening is formed in the fourth conductor layer and in a position of the third surface conductor corresponding to the signal through-hole conductor, and a through-hole pad electrically connected to the signal through-hole conductor is disposed in the inside of the through-hole opening so as to form an annular gap between the through-hole pad and the through-hole opening; a via opening is formed in the fifth conductor layer and in a position of the fourth surface conductor corresponding to the signal through-hole conductor, and third signal via conductors formed to penetrate the third dielectric layer and the fourth dielectric layer while connected to the through-hole pad are disposed in the inside of the via opening; a second path end pad opening is formed in the sixth conductor layer and in a position of the fifth surface conductor corresponding to the signal through-hole conductor, and the second path end pad electrically connected to the third signal via conductors is disposed in the inside of the second path end pad opening so as to form an annular gap between the second path end pad and the second path end pad opening; and the through-hole pad, the via opening, the second path end pad and the second path end pad opening are all disposed concentrically, and an inner diameter $d4$ of the via opening is adjusted to be in the range of $d3 \leq d4 \leq d5$ in which $d3$ is an outer diameter of the through-hole pad, $d4$ is the inner diameter of the via opening, $d5$ is an inner diameter of the second path end pad opening, so that the via opening serves as an impedance adjustment hole.

Formation of a plurality of surface conductors serving as ground layers or power supply layers on the second main surface side of the plate core is effective in securing a plurality of connections to a ground or a power supply on the mother board side which connections are necessary for LSIs, ICs, etc. The first path end pad which is a pad on the first main surface side is formed as a solder land etc. for making a flip-chip connection with an LSI, an IC, etc. Therefore, the first path end pad is relatively small in size. On the other hand, the second path end pad which is a pad on the second main surface side is formed to be larger in size than the first path end pad in order to make a BGA connection or a PGA connection to a mother board. When three surface conductors are formed on the second main surface side in the aforementioned manner and the through-hole pad, the via opening, the second path end pad and the second path end pad opening are all disposed concentrically, the inner diameter $d4$ of the via opening is adjusted to be in the range of $d3 \leq d4 \leq d5$. By use of parasitic capacitance between the second path end pad having a relatively large area and the fourth surface conductor located in the middle of the three layers and in accordance with the inner diameter $d4$, the adjustment margin of the reactance term in the impedance of the signal transmission path can be adjusted in a wider range. As a result, the characteristic impedance of the signal transmission path in a desired frequency band can be adjusted more easily to be matched with its rated value. Particularly, the influence of the signal through-hole conductor apt to cause impedance mismatching can be effectively reduced by the aforementioned adjustment margin in accordance with the via opening inner diameter $d4$.

The second path end pad and the through-hole pad (and the signal through-hole conductor) which are nonstandard impedance portions are totally different in shape from the transmission line (normally formed to have a constant width) and large in area. Therefore, the inductance distribution in the second path end pad and the through-hole pad (and the signal through-hole conductor) is also totally different from that in the transmission line. Accordingly, change behavior of L/C coupling when the opening size is changed is also conspicuously different. Therefore, when adjustment of the inner diameter of the via opening (impedance adjustment opening) is used in combination with adjustment of the inner diameter of the first or second impedance adjustment opening on the first main surface side, the frequency band in which the impedance can be adjusted is further widened so that the degree of freedom in impedance adjustment is further improved.

In this case, preferably, the inner diameter $d4$ of the via opening is adjusted to be in the range of $d3 \leq d4 < d6$ in which $d6$ designates an outer diameter of the second path end pad. The adjustment is set thus for the following reason. When the second path end pad and the via opening are made equal in size (that is, $d4=d6$), a reactance adjustment margin due to parasitic capacitance between the second path end pad and the fifth surface conductor is almost cancelled so that the characteristic impedance adjustment effect on the signal transmission path reaches the peak. On the other hand, when the via opening is enlarged in the condition $d4>d6$, the shield effect on the third via or signal through-hole conductor is insufficient so that loss due to signal leakage is conspicuous.

A plurality of kinds of impedance adjustment openings different in terms of at least one of the shape of the signal transmission path side conductor portion generating parasitic capacitance with the corresponding surface conductor portion around the opening, the size of the signal transmission path side conductor portion, and the relative position relation between the surface conductor portion and the signal transmission path side conductor portion can be provided in combination.

When the shapes or areas of the signal transmission path side conductors opposite to the impedance adjustment openings are different from each other, the inductance distributions in the conductors to be coupled are different. Accordingly, L/C change behavior of L/C coupling when the opening size is changed is also conspicuously different. Not to say, when the relative position relation between the surface conductor portion and the signal transmission path side conductor portion is different, change behavior of L/C coupling is different. Accordingly, in accordance with the adjustment of the inner diameters of the aforementioned different kinds of impedance adjustment openings, the impedance adjustment effect appears in different frequency bands. Therefore, when a plurality of kinds of impedance adjustment openings different in terms of at least one of the shape of the signal transmission path side conductor generating parasitic capacitance with the corresponding surface conductor where the opening is formed, the size of the signal transmission path side conductor, and the relative position relation between the signal transmission path side conductor and the surface conductor are provided in combination, the degree of freedom in adjustment is more improved.

The wiring board according to the invention may be formed as a so-called organic board in which both the plate core and the dielectric layers are formed from a polymeric material (or a composite material containing a polymeric material as a base and an inorganic material) or may be formed as a ceramic board in which both the plate core and the dielectric layers are formed from ceramic (conceptually including glass). In addition, the wiring board according to the invention may be formed as a composite board in which the whole or a partial layer section of the plate core is formed from ceramic while the remaining portion is formed from a polymeric material and the dielectric layers are formed from a polymeric material.

A laminate (in which one conductor layer or at least one of two or more conductor layers serves as a wiring layer in which a conductor line is formed) in which conductor layers and dielectric layers are laminated alternately may be formed on each or only one (exclusive of the third configuration of the invention) of the first main surface and the second main surface of the plate core. The plate core may be formed as a laminate including conductor layers (not including a conductor line but including only surface conductors) and dielectric layers.

BRIEF DESCRIPTION OF THE DRAWINGS

FIG. 1 is a sectional view schematically showing a first embodiment of a wiring board according to the invention.

FIG. 2 is a plan view showing an example of formation of a first path end pad.

FIG. 3 is a plan view schematically showing a first formation mode of an impedance adjustment opening.

FIG. 4 is a plan view showing a concept of adjustment of an inner diameter of the impedance adjustment opening.

FIG. 5 is a schematic plan view showing a first example where a plurality of shield through-hole conductors are provided.

FIG. 6 is a schematic plan view showing a second example where a plurality of shield through-hole conductors are provided.

FIG. 7 is a sectional view schematically showing a second embodiment of the wiring board according to the invention.

FIG. 8 is a plan view showing a concept of adjustment of an inner diameter of a via opening serving as an impedance adjustment opening.

FIG. 9 is a sectional view schematically showing a third embodiment of the wiring board according to the invention.

FIG. 10 is a schematic plan view showing an example of disposition of shield through-hole conductors.

FIG. 11 is a sectional view schematically showing a fourth embodiment of the wiring board according to the invention.

FIG. 12 is an explanatory view showing specifications of respective parts in a wiring board used in an effect confirmation test.

FIG. 13 is a graph showing frequency dependence of a reflection coefficient of a board according to Comparative Example 1.

FIG. 14 is a graph showing frequency dependence of a reflection coefficient of a board according to Comparative Example 2.

FIG. 15 is a graph showing frequency dependence of a reflection coefficient of a board according to Example 1.

FIG. 16 is a graph showing frequency dependence of a reflection coefficient of a board according to Example 2.

[FIG. 17]

FIG. 17 shows first calculation results of characteristic impedance due to a shield through-hole conductor or conductors.

FIG. 18 shows second calculation results of characteristic impedance due to a shield through-hole conductor or conductors.

FIG. 19 is a schematic sectional view showing an example in which a wiring board according to the invention is formed as a ceramic board.

FIG. 20 shows third calculation results of characteristic impedance due to a shield through-hole conductor or conductors.

Figure 1:
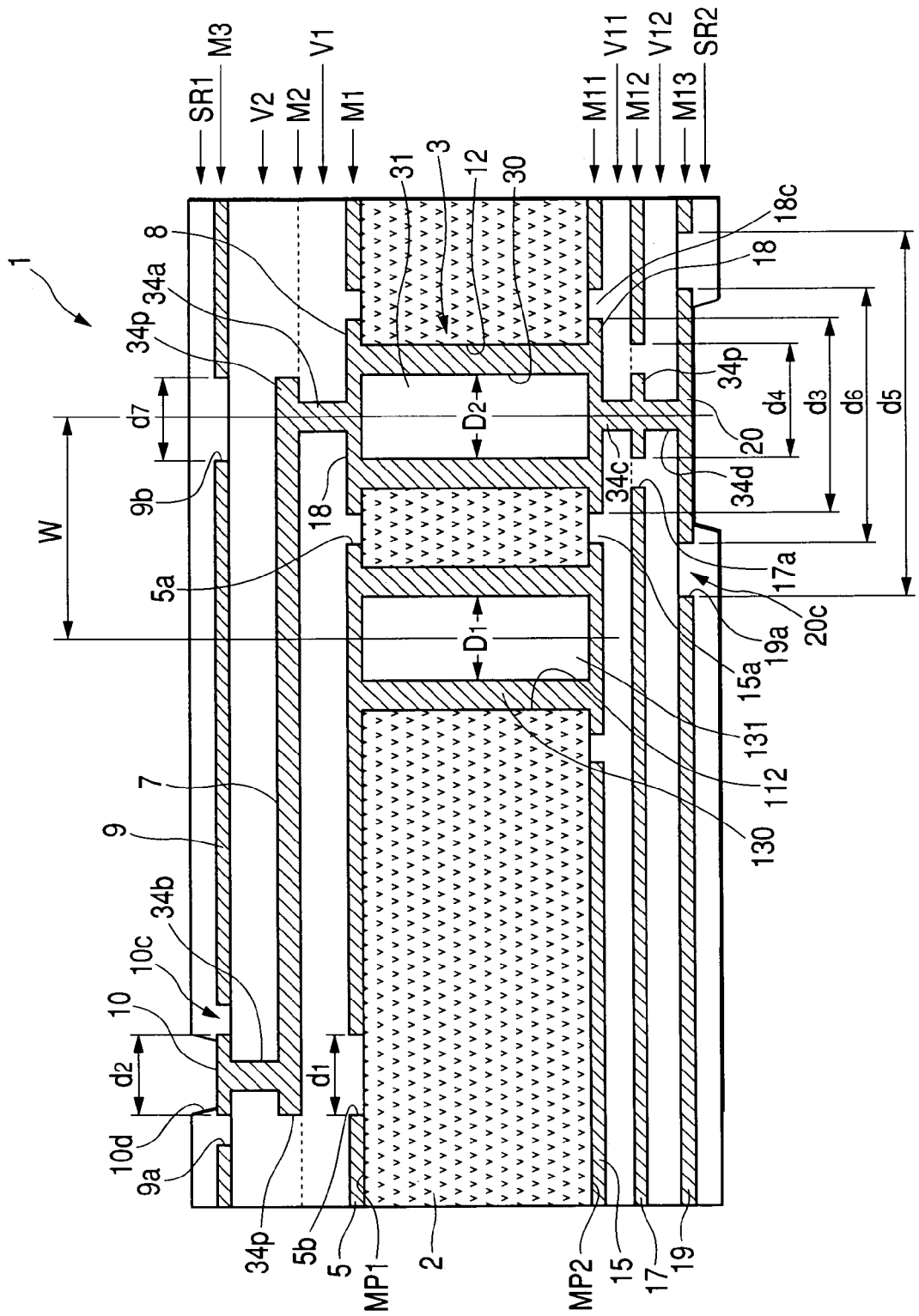
[FIG. 1]

DESCRIPTION OF REFERENCE NUMERALS AND SIGNS 1, 100, 200, 300, 400 wiring board
2 plate core
5 first surface conductor
5b first impedance adjustment opening
7 conductor line
9 second surface conductor
9a first path end pad opening
9b second impedance adjustment opening
10 first path end pad
10c gap
12 signal through-hole
15 third surface conductor
15a through-hole opening
17 fourth surface conductor
17a via opening
18 through-hole pad
18c gap
19 fifth surface conductor
20 second path end pad
30, 230 signal through-hole conductor
34a first signal via conductor
34b second signal via conductor
34c, 34d third signal via conductor
112 shield through-hole
130, 231 shield through-hole conductor
134 shield via conductor
MP1 first main surface
MP2 second main surface
M1 first conductor layer
M2 second conductor layer
M3 third conductor layer
M11 fourth conductor layer
M12 fifth conductor layer
M13 sixth conductor layer
V1 first dielectric layer
V2 second dielectric layer
V11 third dielectric layer
V12 fourth dielectric layer

DETAILED DESCRIPTION OF THE INVENTION

Embodiments of the invention will be described below with reference to the drawings.

FIG. 1 shows a sectional view schematically showing a first embodiment of a wiring board according to the invention. A wiring board 1 has a plate core 2 made of a heat resistant resin plate (such as a bismaleimide triazine resin plate), a fiber reinforced resin plate (such as a glass fiber reinforced epoxy resin plate) or the like.

Figure 2:
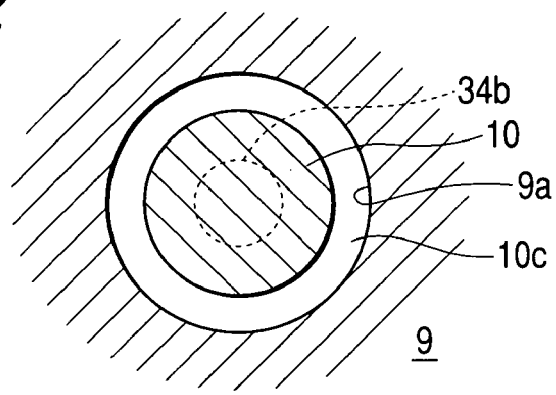
[FIG. 2]

On a first main surface MP1 of the plate core 2, a first conductor layer M1 including a first surface conductor 5, a first dielectric layer V1, a second conductor layer M2 including a conductor line 7, a second dielectric layer V2, and a third conductor layer M3 including a second surface conductor 9 are laminated successively in order of increasing distance from the plate core 2. The conductor line 7 is interposed between the first surface conductor 5 and the second surface conductor 9 so as to form a strip line, A signal through-hole 12 made by a drill or the like so as to penetrate the plate core 2 in the plate thickness direction is formed in the plate core 2 in a position opposite to a first end portion of the conductor line 7. The inner surface of the signal through-hole 12 is covered with a signal through-hole conductor 30 and the inside of the signal through-hole conductor 30 is filled with a filler material 31 formed from a resin such as an epoxy resin. On the other hand, also as shown in FIG. 2, a first path end pad opening 9a is formed in the second surface conductor 9 so as to surround a second signal via conductor 34b. A first path end pad 10 electrically connected to the second signal via conductor 34b is disposed in the inside of the first path end pad opening 9a so as to form an annular gap 10c between the first path end pad 10 and the first path end pad opening 9a.

A first main surface MP1 side end portion of the signal through-hole conductor 30 is connected to the first end portion of the conductor line 7 through a first signal via conductor 34a penetrating the first dielectric layer V1. On the other hand, the second signal via conductor 34b formed to penetrate the second dielectric layer V2 is connected to a second end portion of the conductor line 7, and the first path end pad 10 electrically connected to the second signal via conductor 34b is disposed on the second dielectric layer V2.

Next, a fourth conductor layer M11 including a third surface conductor 15, a third dielectric layer V11, a fifth conductor layer M12 including a fourth surface conductor 17, a fourth dielectric layer V12, and a sixth conductor layer M13 including a fifth surface conductor 19 are laminated successively on a second main surface MP2 of the plate core 2 in order of increasing distance from the plate core 2. A through-hole opening 15a is formed in the fourth conductor layer M11 and in a position of the third conductor 15 corresponding to the signal through-hole conductor 30. A through-hole pad 10 electrically connected to the signal through-hole conductor 30 is disposed in the inside of the through-hole opening 15a so as to form an annular gap 18c between the through-hole pad 18 and the through-hole opening 15a. A via opening 17a is formed in the fifth conductor layer M12 and in a position of the fourth surface conductor 17 corresponding to the signal through-hole conductor 30. Third signal via conductors 34c and 34d formed to penetrate the third dielectric layer V11 and the fourth dielectric layer V12 while connected to the through-hole pad 18 are disposed in the inside of the via opening 17a. The via conductor 34c on the third dielectric layer V11 side and the via conductor 34d on the fourth dielectric layer V12 side are put on top of each other through a via pad 34p so as to form a stacked via. The through-hole pad 18, the via opening 17a, a second path end pad 20, and a second path end pad opening 19a are all disposed concentrically.

Each of the dielectric layers V1, V2, V11 and V12 is made of a resin dielectric sheet, and specifically formed into a buildup layer out of a photosensitive resin composition. In this embodiment, the photosensitive resin composition contains an epoxy resin or the like into which 10% to 30%, both inclusively, by mass of an insulating filler of $SiO_2$ is mixed, so that the relative dielectric constant $\epsilon$ of the photosensitive resin composition is adjusted to 2 to 4 (e.g. about 3). Incidentally, the dielectric layer may be formed from a non-photosensitive resin composition or may be formed from a ceramic dielectric other than a polymeric material such as a resin.

On the other hand, the first path end pad 10 is a solder land for mounting a semiconductor component (not shown) such as an integrated circuit by a flip-chip mounting technique, and has a structure in which an electroless Ni—P plated layer is covered with an Au plated layer. The second path end pad 20 is a land for connecting the wiring board 1 to a main board such as a mother board in a well-known connection manner such as BGA or PGA, and has a similar structure in which an electroless Ni—P plated layer is covered with an Au plated layer. On the third conductor layer M3 and the sixth conductor layer M13, solder resist layers SR1 and SR2 each formed from a photosensitive resin composition are formed respectively. In the solder resist layer SR1 on the third conductor layer M3 side, an opening portion 10d is formed in one-to-one correspondence with the first path end pad 10 so as to reveal the first path end pad 10 serving as a solder land. Although each of the first path end pad 10 and the second path end pad 20 is illustrated as one piece in FIG. 1, the path end pad 10, 20 may be actually formed as a plurality of pieces (e.g. in an array) in accordance with the number of terminals of a semiconductor component to be mounted.

Each of the surface conductors 5, 9, 15, 17 and 19 is used as a ground layer or a power supply layer, and connected to a ground terminal or a power supply terminal of the mother board through any one of the lands (second path end pad 20) on the secondary main surface side of the board. In this embodiment, each of the surface conductors 9, 15 and 19 is a power supply layer while each of the surface conductors 5 and 17 is a ground layer. When the power supply layers are grounded in term of alternating current, each of the surface conductors can be regarded functionally as a conductor layer for giving a potential reference (or a potential zero point) even if it is a power supply layer or a ground layer.

Then, in a position adjacent to the signal through-hole 12 in the plate core 2, a shield through-hole 112 is formed to penetrate the plate core 2 in the plate thickness direction. In order to shield a high-frequency signal transmitted through the signal through-hole 30, the inner surface of the shield through-hole 112 is covered with a shield through-hole conductor 130. The shield through-hole conductor 130 is provided to be connected to the first surface connector 5 which is a surface conductor on the first main surface MP1 side of the plate core 2. An interaxis distance w between the signal through-hole conductor 30 and the shield through-hole conductor 130 is adjusted so that characteristic impedance Z0' of a shield transmission path structure formed by the signal through-hole conductor 30 and the shield through-hole conductor 130 is in the range of Z0±20 Ω.

Portions of the first surface conductor 5 and the second surface conductor 9 opposite to the conductor line 7 form a strip line together with the conductor line 7. The dielectric constants and thicknesses of the via layers V1 and V2 and the line width and thickness of the conductor line 7 (the thickness is not so important in a high frequency band in which a skin effect is predominant) are selected so that characteristic impedance of the strip line is designed to be a rated value Z0 (e.g. 50 Ω). As described above, on a signal transmission path from the first path end pad 10 to the second path end pad 20, the via conductors 34b, 34a, 34c and 34d, the signal through-hole conductor 30, the first path end pad 10, the second path end pad 20, etc. which are not constituent members of the strip line are included in addition to the portion (standard impedance portion) formed as the strip line. Since the shield effect made by the surface conductors 5 and 9 hardly exerts influence on these members, it is a matter of course that these members form a nonstandard impedance portion having a different impedance equivalent circuit structure from that of the strip line. Accordingly, even if the characteristic impedance of the standard impedance portion is designed to be a rated value, the characteristic impedance of the whole signal transmission path from the first path end pad 10 to the second path end pad 20 will be shifted from the rated value complexly due to the influence of the nonstandard impedance portion, so that impedance mismatching will be generated.

In the embodiment shown in FIG. 1, however, the shield through-hole conductor 130 is located in a position adjacent to the signal through-hole conductor 30 in the plate core 2. Further, the interaxis distance w between the two through hole conductors 30 and 130 is adjusted so that the characteristic impedance Z0' of the shield transmission path structure (hereinafter referred to as "through-hole transmission path structure") formed by the signal through-hole conductor 30 and the shield through-hole conductor 130 is in the range of Z0±20 Ω where Z0 designates the characteristic impedance of the strip line or the microstrip line (standard impedance portion) constituting a main portion of the signal transmission path. Parasitic capacitance between the signal through-hole conductor 30 and the shield through-hole conductor 130 varies largely in accordance with adjustment of the interaxis distance w, so that the characteristic impedance of the signal transmission path as a whole can be adjusted in a comparatively wide range using the width of change of the parasitic capacitance as an adjustment margin. Accordingly, by adjustment of the interaxis distance w, the characteristic impedance of the signal transmission path can be adjusted easily to be matched with the rated value. For example, the characteristic impedance (or admittance which is the reciprocal of the characteristic impedance) of the signal transmission path at a desired frequency is simulated while the size (inner diameter) of the interaxis distance w is changed. The results of the simulation are plotted on a Smith chart so that an interaxis distance w providing a plotted point closest to the center point of the Smith chart can be found out. Particularly, the parasitic capacitance between the two through-hole conductors 30 and 130 varies largely in accordance with change of the interaxis distance w. In an equivalent circuit of the characteristic impedance of the signal transmission path, the change of the interaxis distance w leads to a change in parallel capacitance to the transmission line. Accordingly, for example, when the Smith chart showing the admittance is used, increase or decrease in parasitic capacitance due to the interaxis distance w appears as an effect of moving an admittance plotted point on a constant susceptance circle.

Figure 5:
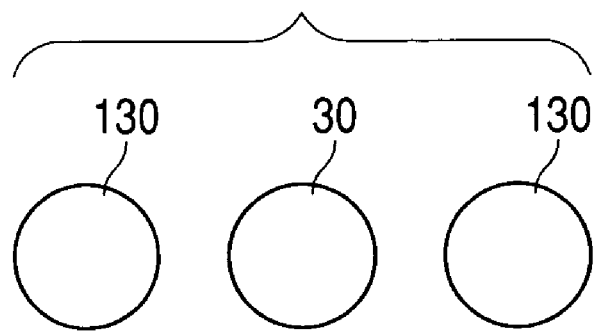
[FIG. 5]
Figure 6:
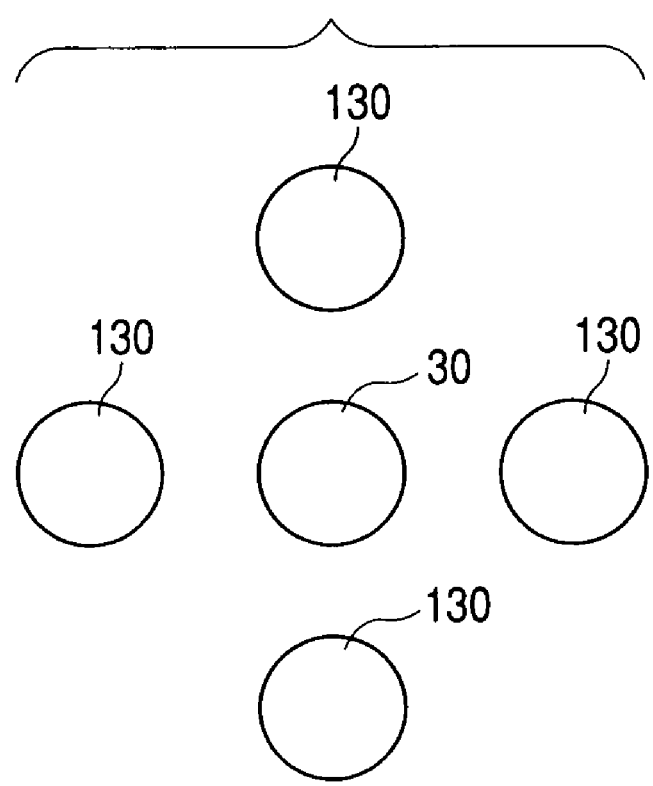
[FIG. 6]

Incidentally, as shown in FIGS. 5 and 6, a plurality of shield through-hole conductors 130 can be disposed around the signal through-hole conductor 30. In this manner, the shield effect on the signal through-hole conductor 30 is enhanced, so that transmission loss can be suppressed more effectively. FIG. 5 shows an example in which two shield through-hole conductors 130 are provided in symmetrical positions around the signal through-hole conductor 30. FIG. 6 shows an example in which four shield through-hole conductors 130 are provided at equal angular intervals with the signal through-hole conductor 30 as the center. Incidentally, as the number of the shield through-hole conductors 130 increases, the parasitic capacitance generated between the signal through-hole conductor 30 and the shield through-hole conductors 130 increases. Accordingly, when the characteristic impedance of the through-hole transmission path structure is to be set at the same value, the interaxis distance w between each shield through-hole conductor 130 and the signal through-hole conductor 30 has to be increased as the number of the shield through-hole conductors 130 increases. When a plurality of signal through-hole conductors 30 are formed in the plate core 2, an interaxis distance l between adjacent ones of the signal through-hole conductors 30 is preferably set at least twice, more preferably at least 2.5 times, as large as the interaxis distance w between each signal through-hole conductor 30 and each shield through-hole conductor 130, in order to increase the degree of freedom in adjustment of the characteristic impedance by the interaxis distance w.

Next, when the outer diameters D1 and D2 of the shield through-hole conductor 130 and the signal through-hole conductor 30 are adjusted, the characteristic impedance Z0' of the shield transmission path structure formed by the shield through-hole conductor 130 and the signal through-hole conductor 30 can be set to be in the range of Z0±20 Ω. The parasitic capacitance between the signal through-hole conductor 30 and the shield through-hole conductor 130 varies largely not only in accordance with the interaxis distance w but also in accordance with the conductor outer diameters D2 and D1. Accordingly, the characteristic impedance of the signal transmission path as a whole can be adjusted in a comparatively wide range using the width of the change in parasitic capacitance as the adjustment margin. Accordingly, by adjustment of the conductor outer diameters D1 and D2, the characteristic impedance of the signal transmission path can be adjusted easily to be matched with the rated value. For example, the characteristic impedance (or admittance which is the reciprocal of the characteristic impedance) of the signal transmission path at a desired frequency is simulated while the conductor outer diameters D1 and D2 (whose values may be set to be equal to each other or different from each other if necessary) are changed. The results of the simulation are plotted on a Smith chart, so that conductor outer diameters D1 and D2 providing a plotted point closest to the center point of the Smith chart can be found out. Particularly, the parasitic capacitance and the inductance between the two through-hole conductors 30 and 130 vary largely in accordance with the changes of the conductor outer diameters D1 and D2. In an equivalent circuit of the characteristic impedance of the signal transmission path, the changes of the conductor outer diameters D1 and D2 lead to a change in parallel capacitance and inductance to the transmission line. Both the changes contribute only to a susceptance term. Accordingly, when the Smith chart showing the admittance is used, increase or decrease in parasitic capacitance due to the conductor outer diameters D1 and D2 appears as an effect of moving an admittance plotted point on a constant susceptance circle, in the same manner as in the case where the interaxis distance is changed.

Figure 3:
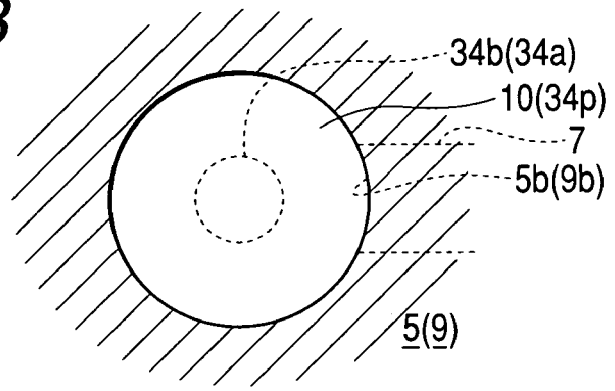
[FIG. 3]

Next, in a position of the first surface conductor 5 opposite to the second end portion of the conductor line 7, a first impedance adjustment opening 5b for adjusting the characteristic impedance of the signal transmission path is provided. In a position of the second surface conductor 9 opposite to the first end portion of the conductor line 7, a second impedance adjustment opening 9b for adjusting the characteristic impedance of the signal transmission path is provided. FIG. 3 shows an example of a formation mode of the impedance adjustment opening 5b, 9b in a plan view.

By adjustment of the opening size of each of the first impedance adjustment opening 5b and the second impedance adjustment opening 9b, the characteristic impedance of the signal transmission path can be adjusted easily to be matched with the rated value. In this case, the characteristic impedance (or admittance which is the reciprocal of the characteristic impedance) of the signal transmission path at a desired frequency may be simulated while the size (inner diameter) of the opening 5b, 9b is changed. The results of the simulation are plotted on a Smith chart so that a size of the opening 5b, 9b providing a plotted point closest to the center point of the Smith chart can be found out. Particularly, comparatively large parasitic capacitance is generated between the first surface conductor 5 and the first path end pad 10 in spite of two dielectric layers interposed therebetween. Therefore, the first impedance adjustment opening 5b formed in the first surface conductor 5 has an advantage that it can set a large adjustment margin of the impedance.

Figure 4:
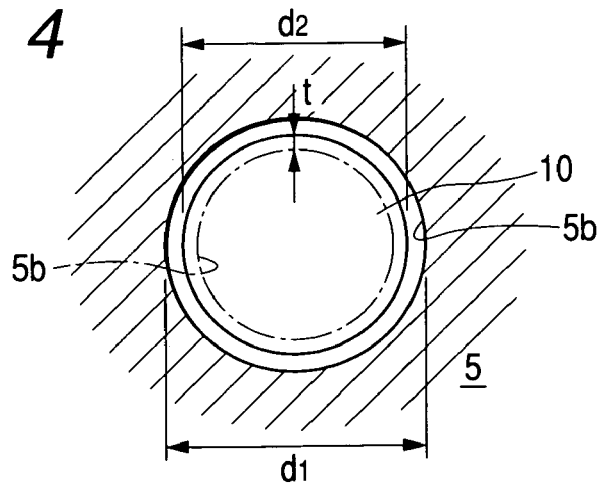
[FIG. 4]

As shown in FIG. 4, assume that the inner diameter of the first impedance adjustment opening 5b is d1 and the outer diameter of the first path end pad 10 is d2. In this case, when d1<d2, an overlap equal to a diameter difference t (=d2−d1) is generated between the first surface conductor 5 and the first path end pad 10, as shown in the chain line in FIG. 4. This overlap becomes a reactance adjustment margin due to the parasitic capacitance. As the diameter difference t decreases, the parasitic capacitance decreases so that the reactance increases. The effect, however, reaches almost the peak when t=0 (that is, when d1=d2: this condition is used in the embodiment). Although the condition can be set to be d1>d2, this will cause decrease in the reactance adjustment effect, Accordingly, it can be said that d1 is preferably set not to be unnecessarily increased in the region where lowering of the shield effect on the line conductor 7, that is, loss due to signal leakage, should be prevented from being generated excessively. Since the parasitic capacitance is decreased as the size of the opening is increased, it can be said that d1 is preferably set to be as close to d2 as possible when the reactance term is to be increased as much as possible in impedance matching. In addition, an inner diameter d7 of the second impedance adjustment opening 9b is preferably adjusted to be in the range of d7<5 w in which w is the width of the line conductor, so that loss due to signal leakage can be likewise prevented from being generated excessively.

Figure 7:
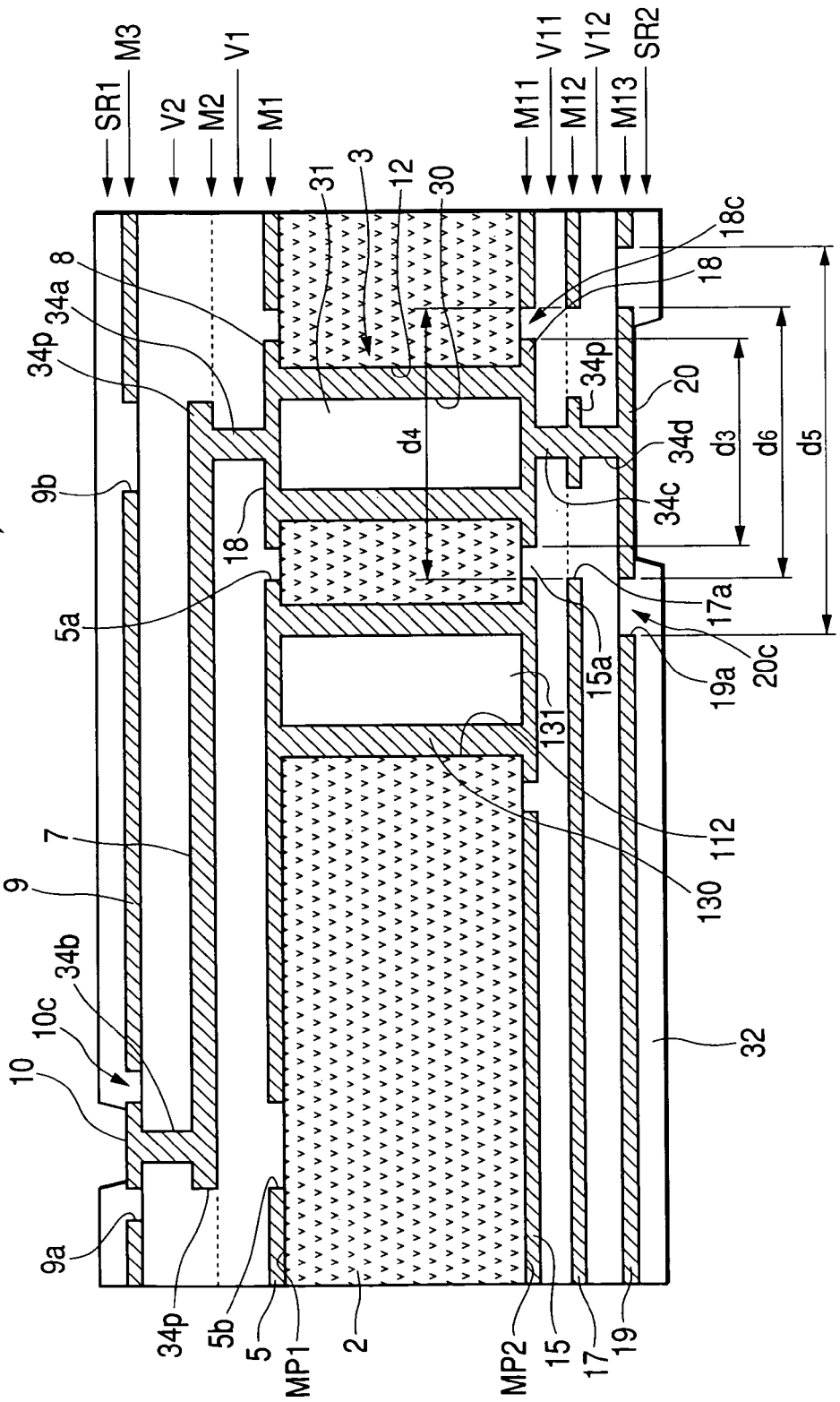
[FIG. 7]
Figure 8:
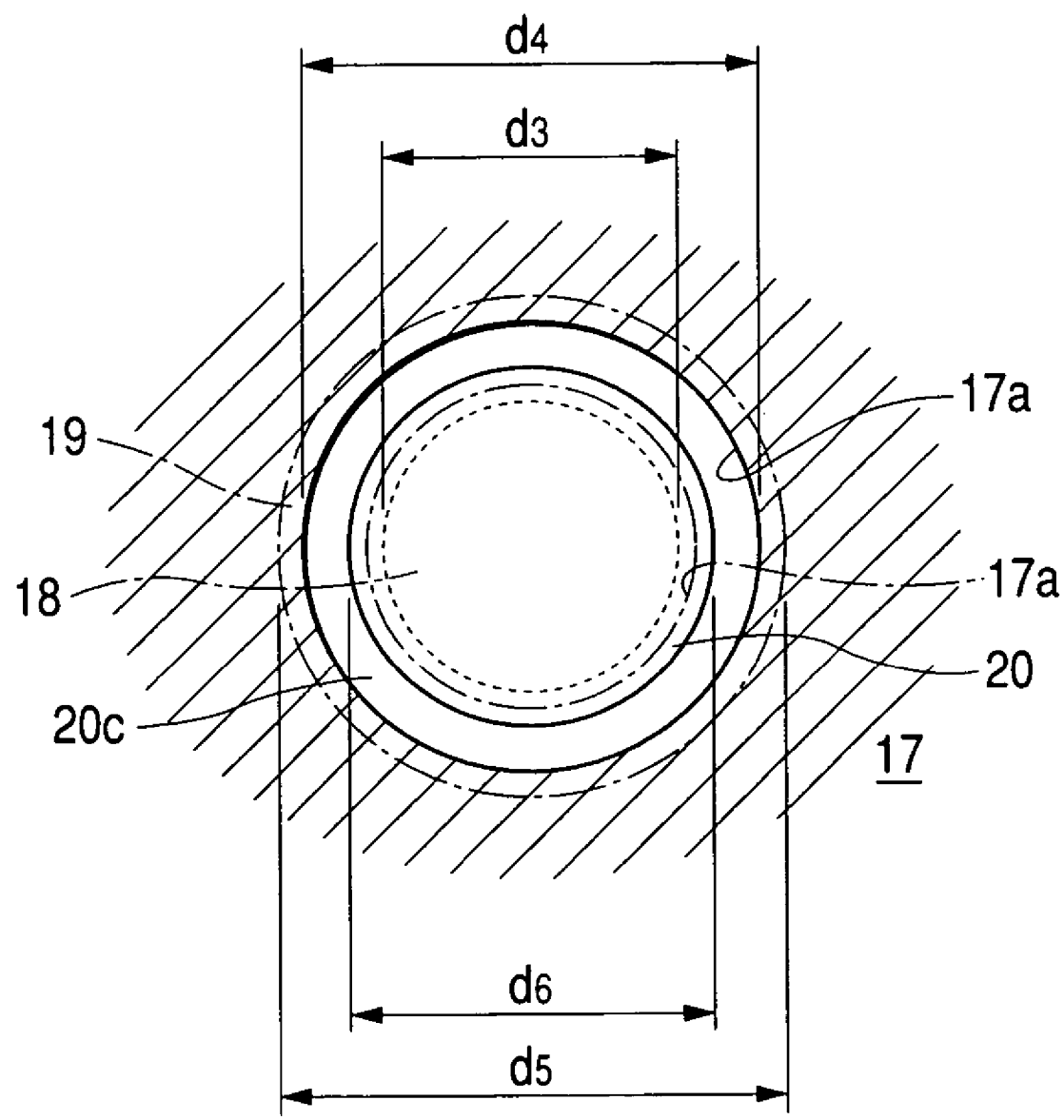
[FIG. 8]

FIG. 7 shows a wiring board 100 according to a second embodiment of the invention. The basic structure is the same as that of the wiring board 1 depicted in FIG. 1. Therefore, common members to those of the wiring board 1 including dimensions etc. are referenced correspondingly, and detailed description thereof will be omitted. Only points of difference from the wiring board 1 will be described below in detail. In the wiring board 100, respective members, that is, a through-hole pad 18, a via opening 17a and a second path end pad opening 19a are disposed concentrically on the second main surface MP2 side. An inner diameter d4 of the via opening 17a is adjusted so as to be in the range of d3≦d4≦d5 in which d3 is an outer diameter of the through-hole pad 18, d4 is the inner diameter of the via opening 17a and d5 is an inner diameter of the second path end pad opening 19a, as shown in FIG. 8. In the configuration, parasitic capacitance between a second path end pad 20 having a comparatively large area and a fourth surface conductor 17 located in the middle of three surface conductors 15, 17 and 19 is adjusted in accordance with the inner diameter d4 of the via opening 17a so that an adjustment margin of a reactance term in impedance of a signal transmission path can be set to be larger. Particularly in a high frequency band not lower than 1 GHz (e.g. up to 10 GHz, particularly up to 5 GHz), the percentages of the reactance term in the characteristic impedance of the signal transmission path as a whole increases so that an adverse influence on impedance matching of the nonstandard impedance portion becomes more conspicuous. In the aforementioned configuration, however, the via opening 17a can be used as an impedance adjustment opening in addition to impedance adjustment openings 5b and 9b on a first main surface MP1 side. Accordingly, impedance matching of the signal transmission path as a whole in a high frequency band can be performed easily when a reactance term is to be increased as much as possible in impedance matching, three openings are all adjusted to be enlarged so that parasitic capacitance can be reduced more effectively. The three openings have different coupling modes between the parasitic capacitance and the transmission path side conductor inductance so that they also have different adjustable frequency bands. For example, only when the size of the via opening 17a is increased, impedance matching in a desired frequency band may not be always obtained. When the adjustment effects of the impedance adjustment holes 5b and 9b are added, good impedance matching in a wider band can be obtained.

When the inner diameter d4 of the via opening 17a is equal to an outer diameter d6 of the second path end pad 20, the effect of reducing the parasitic capacitance between the second path end pad 20 and the fourth surface conductor 17 due to enlargement of d4 becomes dull to increase. Although the condition can be set to be d4>d6, this will reduce the reactance adjustment effect. Accordingly, it is preferable that d4 is set not to be unnecessarily increased in the region where lowering of the shield effect on third signal via conductors 34c and 34d or a signal through-hole conductor 30, that is, loss due to signal leakage should be prevented from being generated excessively. When d4 is increased, the parasitic capacitance is decreased. It can be therefore said that d4 is preferably set to be as close to d6 as possible (d4=d6 in the embodiment) when the reactance term is to be increased as much as possible in impedance matching. In any case, the parasitic capacitance between the third surface conductor 15 and the through-hole pad 18 can be likewise reduced when the condition is set to be d3≦d4.

Figure 9:
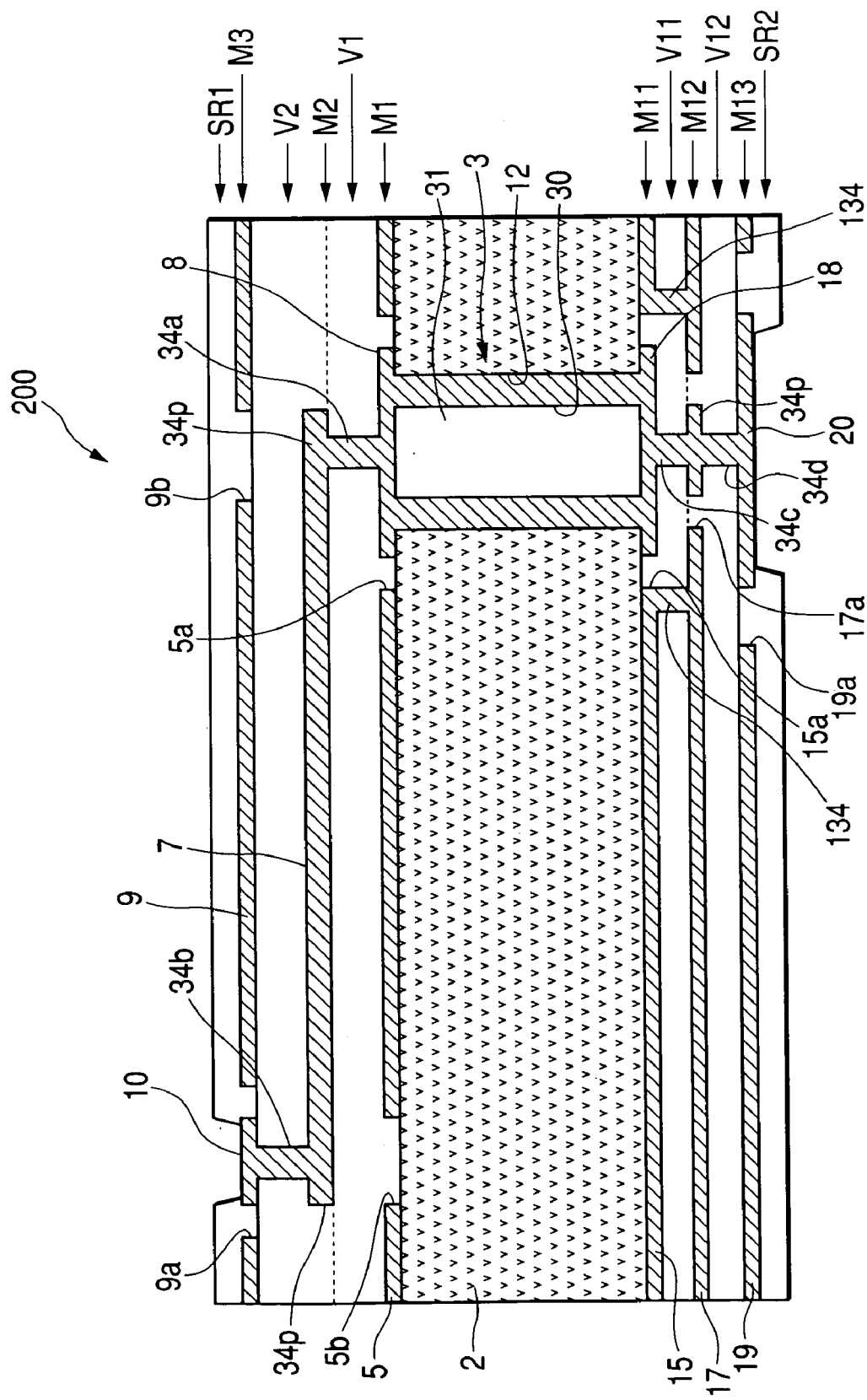
[FIG. 9]
Figure 10:
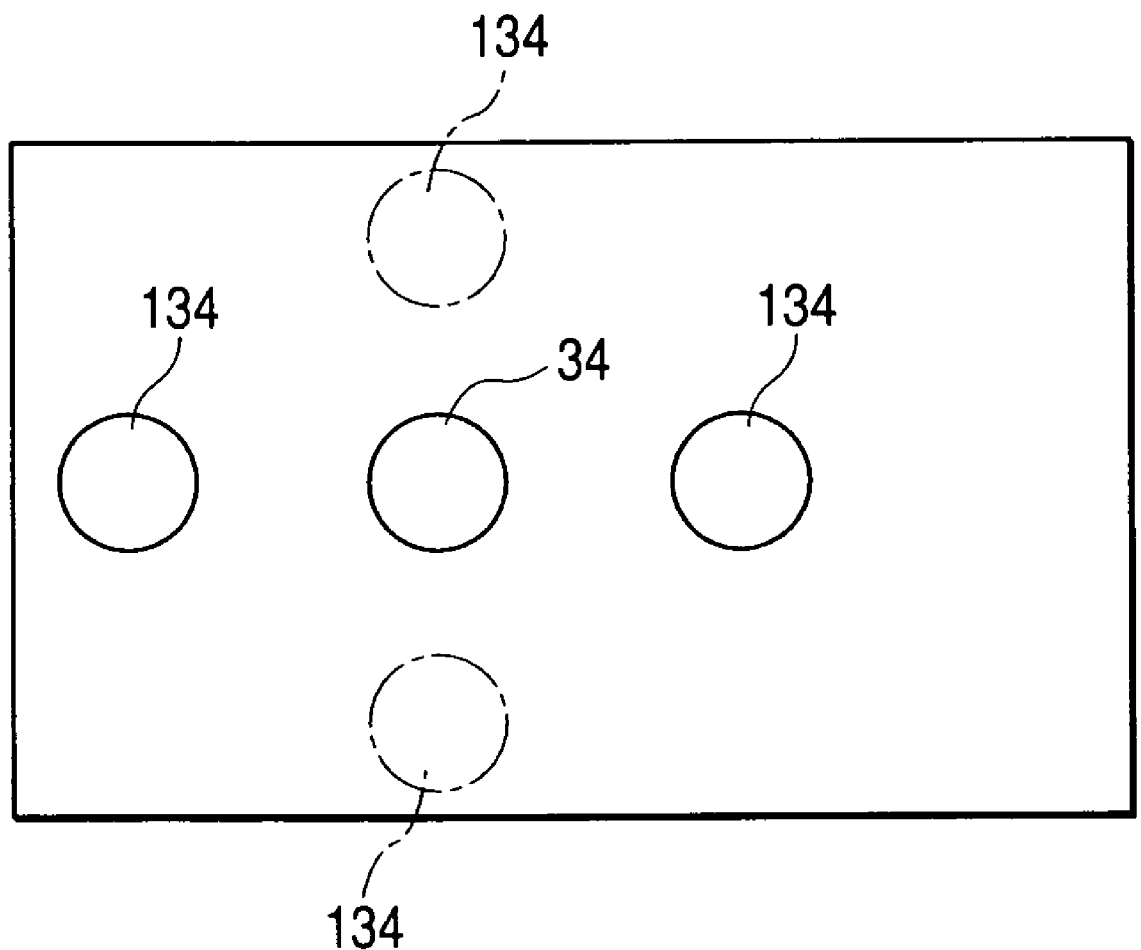
[FIG. 10]

FIG. 9 shows a wiring board 200 according to a third embodiment of the invention. The basic structure is the same as that of the wiring board 1 depicted in FIG. 1. Therefore, common members including dimensions etc. to those of the wiring board 1 are referenced correspondingly, and detailed description thereof will be omitted only points of difference from the wiring board 1 will be described below. In the configuration, in a third dielectric layer V11, shield via conductors 134 for shielding a high-frequency signal transmitted through third signal via conductors 34c and 34d are provided to connect a third surface conductor 15 and a fourth surface conductor 17 to each other. When the shield via conductors 134 are disposed in positions adjacent to the third signal via conductors 34c and 34d which belong to a nonstandard impedance portion, the shield effect on the third signal via conductors 34c and 34d is enhanced so that transmission loss can be suppressed. In addition, the shield via conductors 134 act advantageously to attain impedance matching of the signal transmission path as a whole. In the embodiment, the shield via conductors 134 are disposed to be connected to the fourth surface conductor 17 in an inner circumferential edge portion of a via opening 17a in order to make the shield via conductors 134 as close to a signal through-hole conductor 30 as possible. In the embodiment, as shown in FIG. 10, a plurality of shield via conductors 134, specifically, two shield via conductors 134, are disposed around the third signal via conductors 34c and 34d so that a shield effect on the third signal via conductors 34c and 34d can be enhanced. Incidentally, the number of shield via conductors 134 can be further increased as shown by the chain line in FIG. 10.

Figure 11:
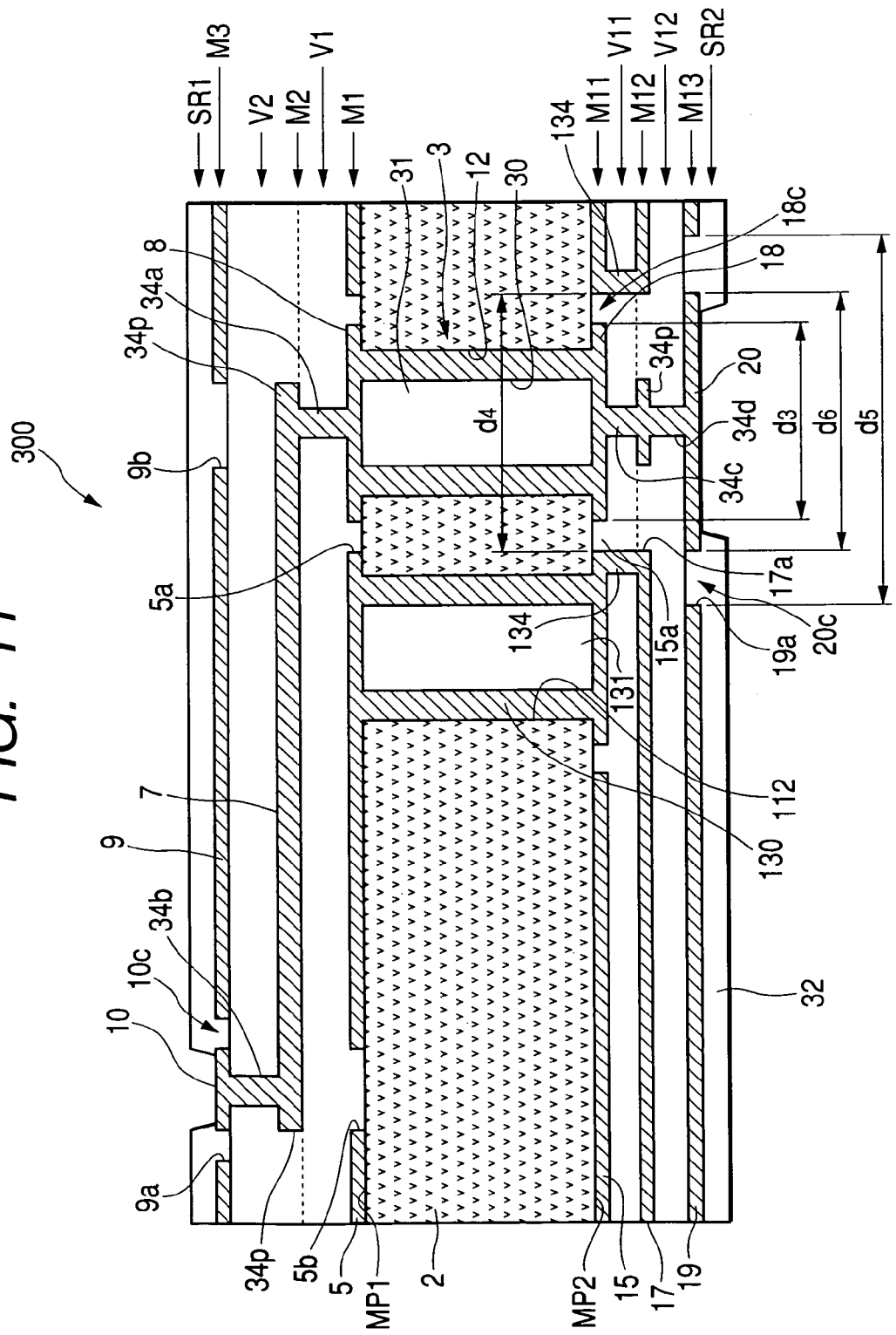
[FIG. 11]

FIG. 11 shows a wiring board 300 in which shield via conductors 134 shown in FIG. 9 are added to the wiring board 100 shown in FIG. 7 by way of example.

Figure 19:
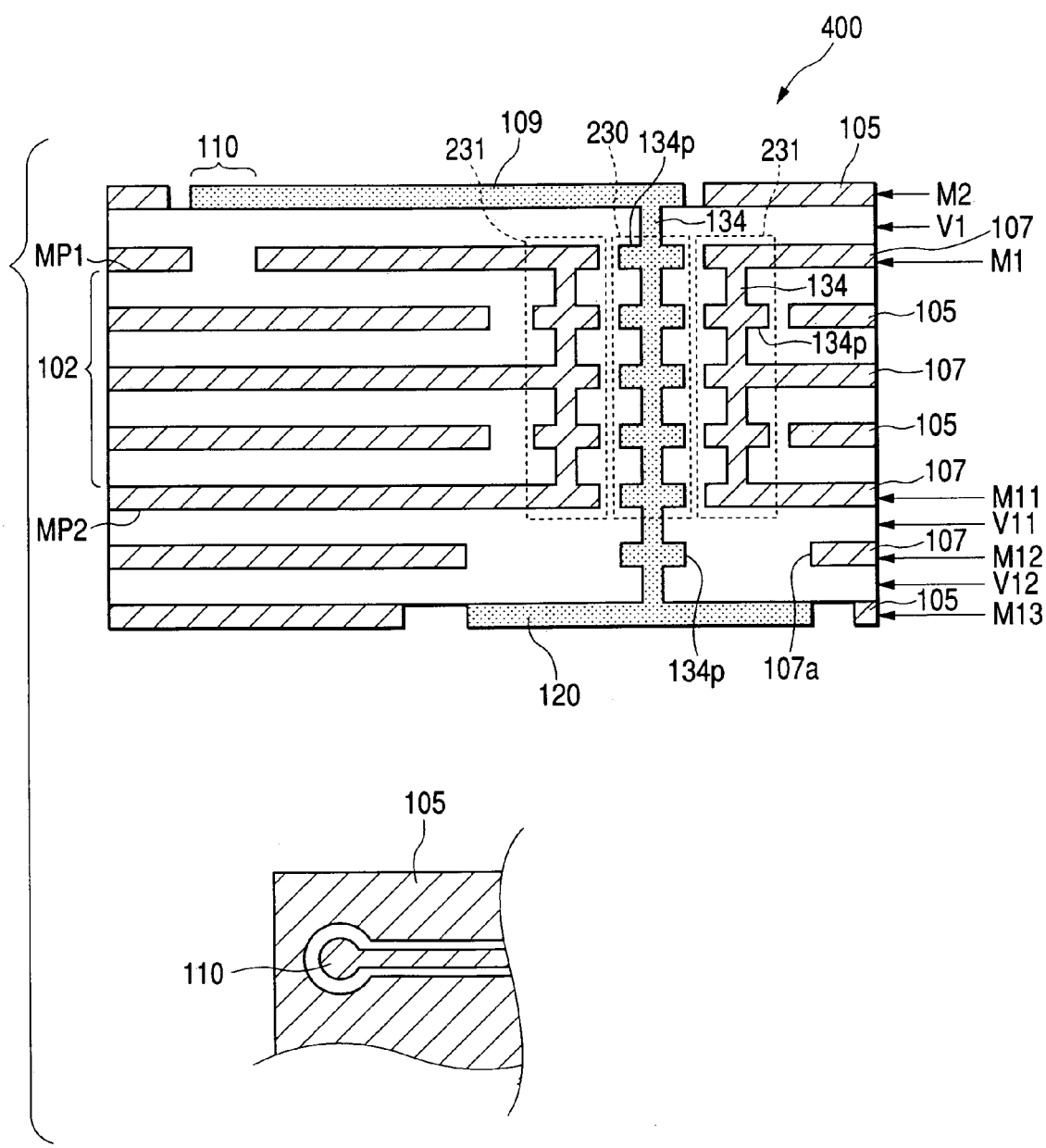
[FIG. 19]

FIG. 19 shows an example in which a board structure corresponding to that in FIG. 7 is achieved as a ceramic board. In a wiring board 400, a first conductor layer M1 including a first surface conductor 107, a first dielectric layer V1, a conductor line 109, and a second conductor layer M2 including a second surface conductor 105 are laminated successively on a first main surface MP1 of a plate core 102 in order of increasing distance from the plate core 102. The conductor line 109 and the second surface conductor 105 form a coplanar waveguide. Each of dielectric layers is wholly formed from ceramic (e.g. alumina or glass ceramic), while the plate core 102 is formed by laminating the first surface conductors 105 (e.g. for ground) and the second surface conductor 107 (e.g. for power supply) alternately with the ceramic dielectric layers.

A signal through-hole conductor 230 made of a stacked via (formed by connecting shield via conductors 134 penetrating respective dielectric layers to each other through via pads. 134p between the layers) so as to penetrate the plate core 102 is connected to a first end portion of the conductor line 109.

Shield through-hole conductors 231 each made of a stacked via likewise are formed in the plate core 102 in positions adjacent to the signal through-hole conductor 230 so as to penetrate the plate core 102 in the plate thickness direction. The shield through-hole conductors 231 are provided so as to be connected to the first conductor 107 constituting the plate core 102. An interaxis distance between the signal through-hole conductor 230 and each shield through-hole conductor 231 or a conductor outer diameter (represented by an outer diameter of the shield via conductors 134 in this case) is adjusted so that characteristic impedance Z0' of a shield transmission path structure constituted by the signal through-hole conductor 230 and the shield through-hole conductors 231 is in the range of Z0±20 Ω. Incidentally, the laminated structure on a second main surface MP2 side of the plate core 102 is almost the same as that in FIG. 7.

EXAMPLES

Figure 12:
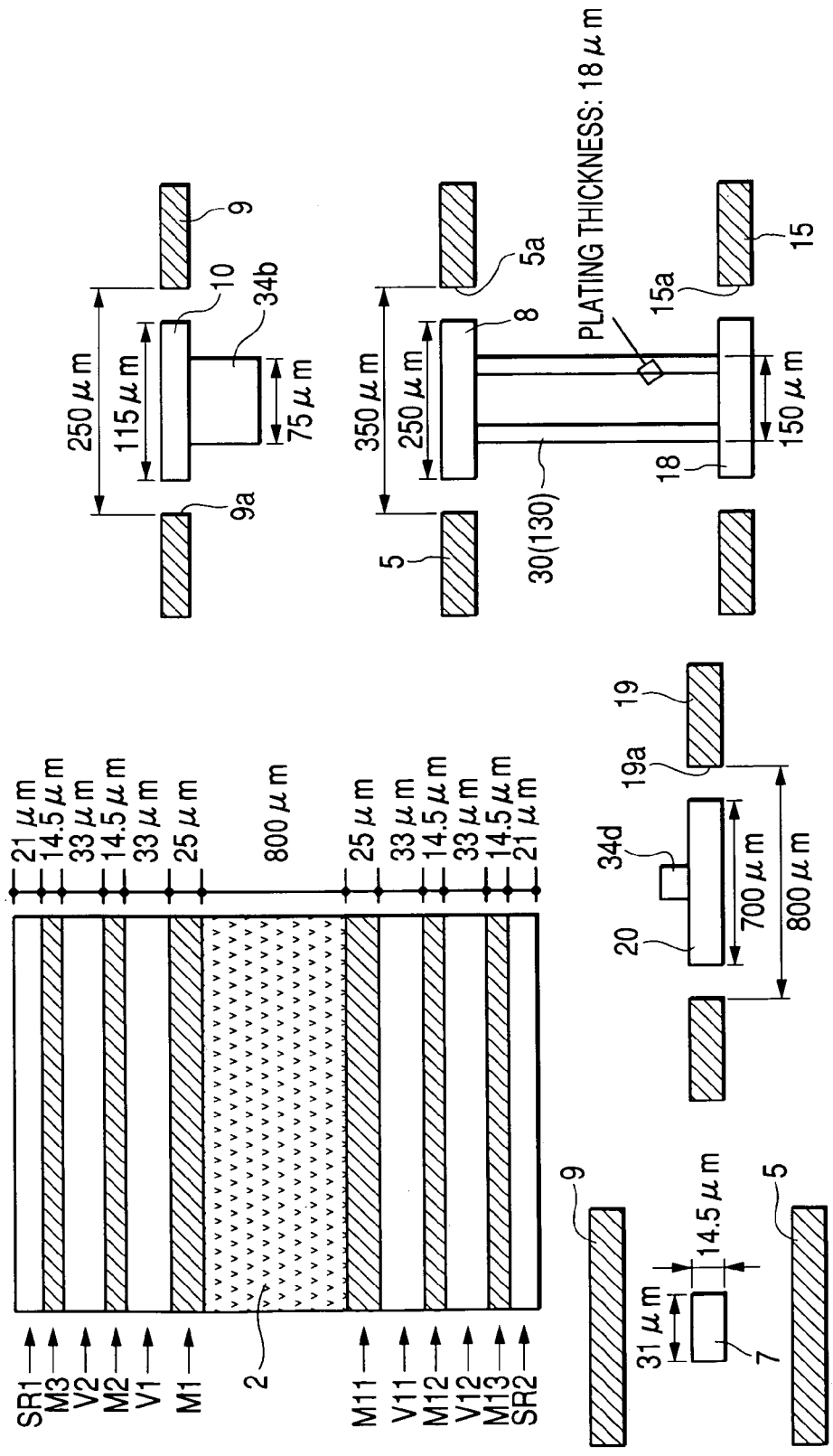
[FIG. 12]

Test results for confirming the effect of the invention will be described below. A wiring board in which a thickness of each layer in the wiring boards 1 and 100 in FIGS. 1 and 7 and a size of each portion (corresponding to the reference numerals used in FIGS. 1 and 7) were adjusted as shown in FIG. 12 was produced by a well-known buildup method. An inner diameter of each of a first impedance adjustment opening 5b and a second impedance opening 9b was 115 µm. Further, an inner diameter d4 of a via opening 17a was 250 µm (the type of the wiring board 1 in FIG. 1) and one or two shield through-hole conductors 130 were formed to have the same size and thickness as those of the signal through-hole conductor 30. As shown in FIG. 17, characteristic impedance of the single signal through-hole conductor 30 alone is 91.2 Ω. FIG. 17 shows calculation results as to how the value of characteristic impedance Z0' of a through-hole transmission path structure formed by the signal through-hole conductor 30 and the shield through-hole conductor(s) 130 changes in accordance with the interaxis distance (pitch) between the conductors 30 and 130 when one, two, three or four shield through-hole conductors 130 are formed (also showing calculation results in the case of two or four shield through-hole conductors 130 for the sake of reference). In the embodiment, the pitch is adjusted so as to set the characteristic impedance Z0' of the through-hole transmission path structure at 50 Ω. An outer diameter (sectional diameter) of each of the shield through-hole conductor(s) 130 and the signal through-hole conductor 30 is set at 150 µm.

Two kinds of boards for measurement were produced. That is, one kind of board (board sample (3): Example 1) had one shield through-hole conductor 130 while the other kind of board (board sample (4): Example 2) had two shield through-hole conductors 130. In addition, a board (board sample (2): Comparative Example 2) in which the shield through-hole conductor 130 was removed from the board sample (3), and a board (board sample (1): Comparative Example 1) in which the shield through-hole conductor 130 was removed from the board sample (3) and the first impedance adjustment opening 5b and the second impedance adjustment opening 9b were not formed, were produced.

A probe (characteristic impedance: 50 Ω) was mounted on each of the board samples (1) to (4) so that a first path end pad 10 (terminal 1) of the board sample served as a signal input side while a second path end pad 20 (terminal 2) thereof served as a signal output side. A reflection coefficient S11 in the first path end pad 10 in a frequency band up to 50 GHz was measured S by a commercially available network analyzer (8510C made by Agilent Technologies).

Figure 13:
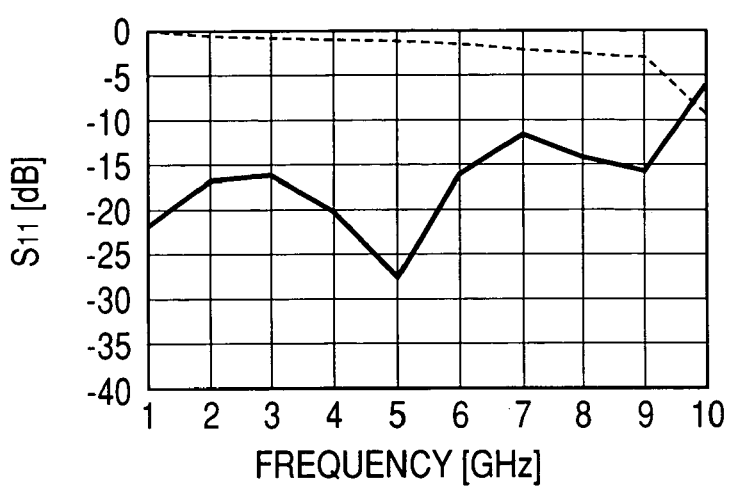
[FIG. 13]
Figure 14:
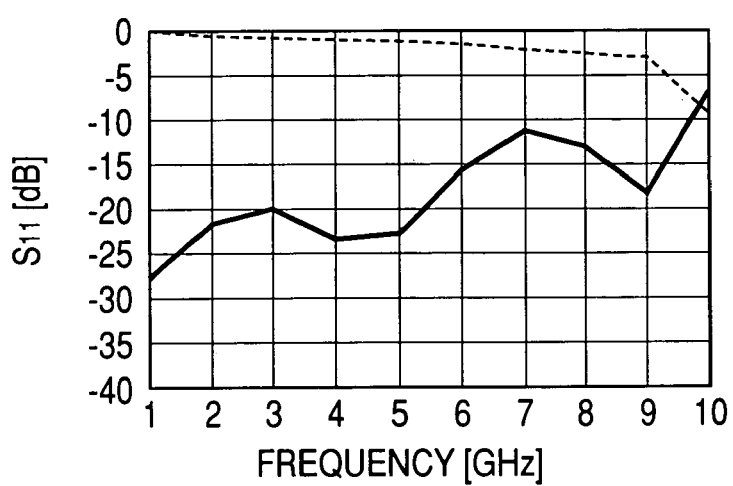
[FIG. 14]
Figure 15:
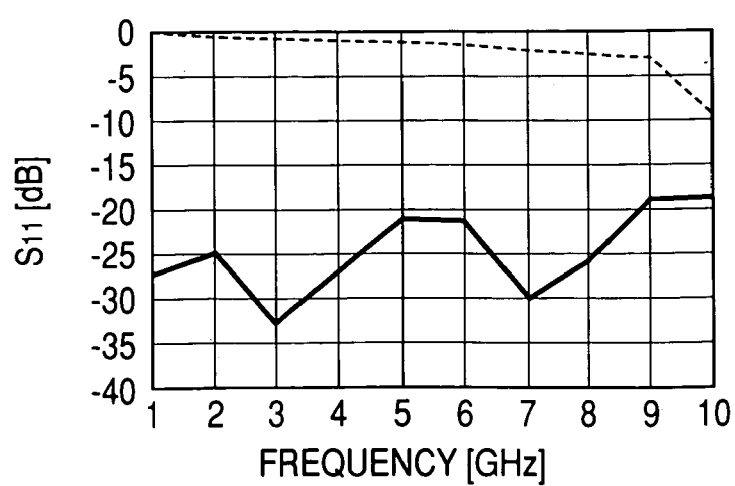
[FIG. 15]
Figure 16:
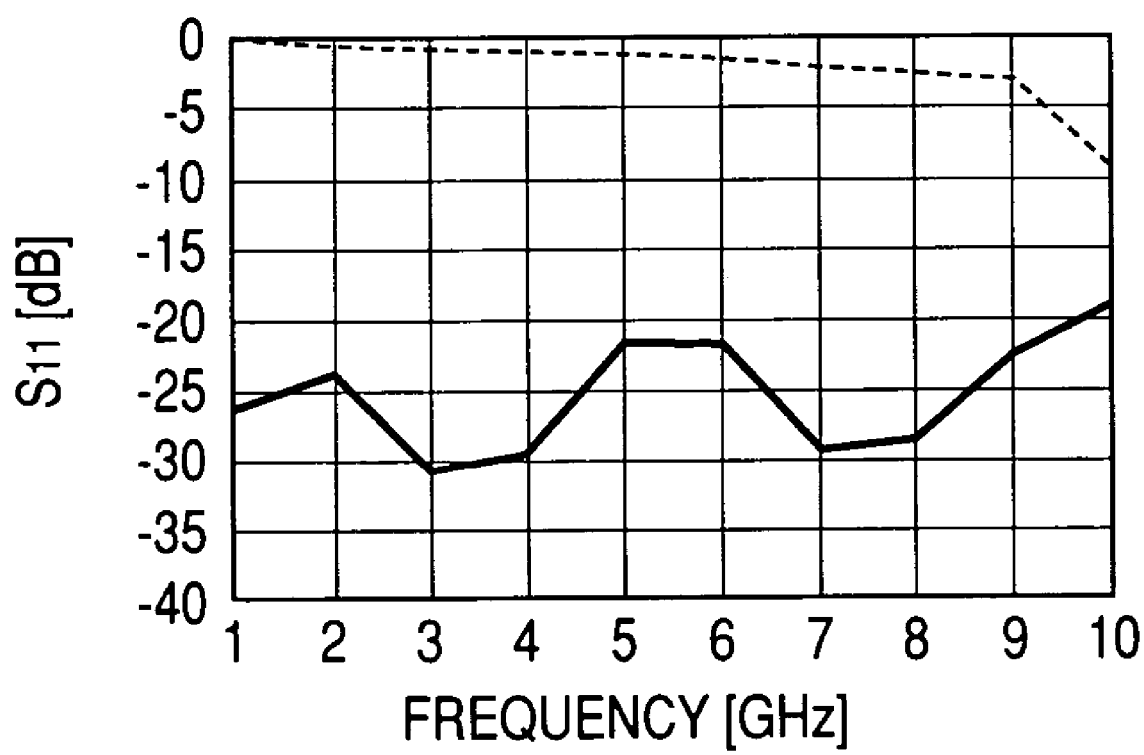
[FIG. 16]

FIG. 13 shows a measurement result of the board sample (1) (Comparative Example 1). In FIG. 13, although an attenuation extreme is found in the vicinity of 5 GHz, a high reflection coefficient not smaller than −20 dB is generally shown in a frequency band not lower than 1 GHz. Thus, a good impedance matching state cannot be obtained. On the other hand, FIG. 14 shows a measurement result of the board sample (2) (Comparative Example 2). Although a reflection coefficient in a frequency band up to 5 GHz is somewhat improved, it cannot be said that the improvement is sufficient. As shown in FIG. 15, in the board sample (3) (Example 1) having one shield through-hole conductor 130 formed therein, the band in which a reflection coefficient is smaller than −20 dB expanded up to the vicinity of 9 GHz, and the reflection coefficient can be even reduced to be not larger than −25 dB except a part of the band. As shown in FIG. 16, it is proved that, in the board sample (4) (Example 2) having two shield through-hole conductors 130 formed therein, the band in which a reflection coefficient is smaller than −20 dB is secured up to the vicinity of 10 GHz. Thus, it is proved that a better impedance matching state can be obtained.

Figure 18:
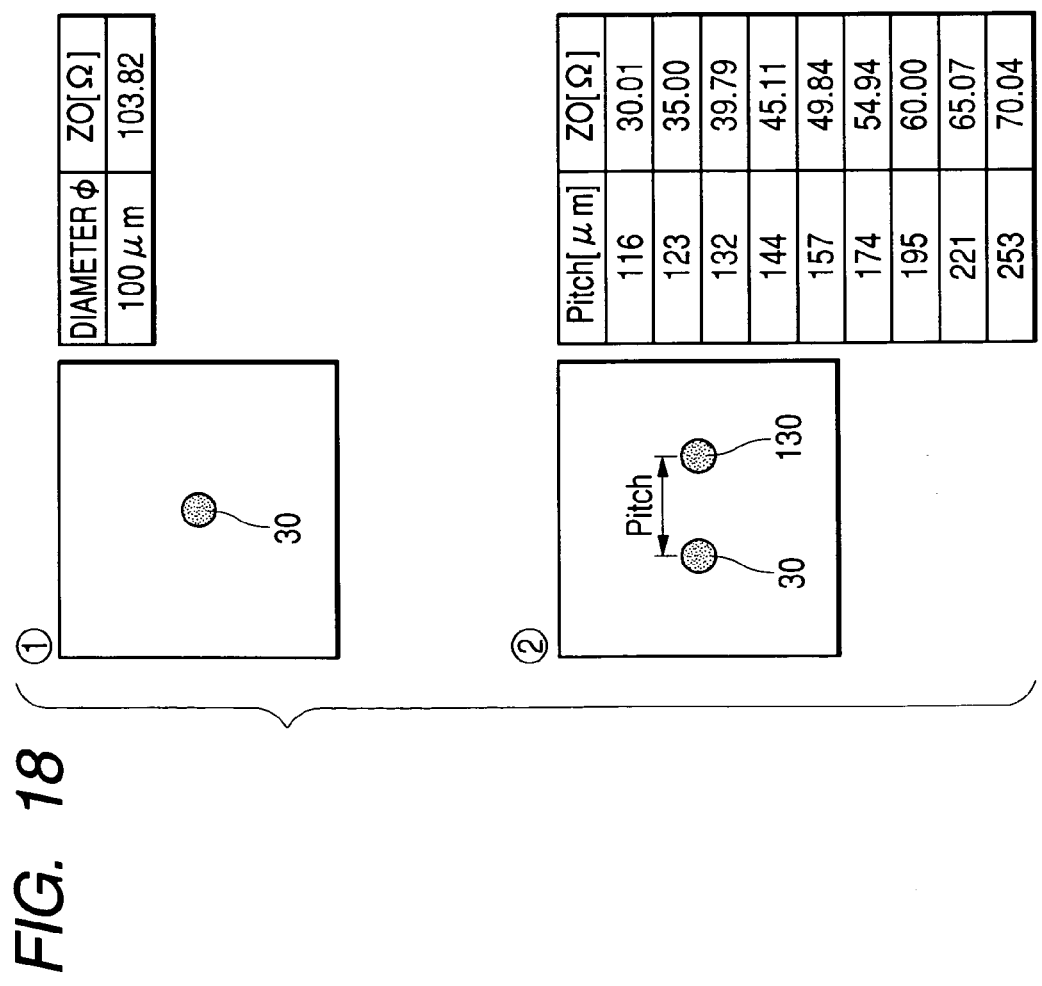
[FIG. 18]

FIG. 18 shows results of the same calculation conducted on board samples (1) to (4) produced in absolutely the same manner as in FIG. 17 except that an outer diameter (sectional diameter) of each of a shield through-hole conductor or conductors 130 and a signal through-hole conductor 30 was set at 100 µm. According to the results, in each board sample, the value of interaxis distances providing characteristic impedance Z0 almost matched with 50 Ω is greatly smaller than that in FIG. 17. For example, in the case of the board sample (4) in FIG. 17 in which the interaxis distance cannot help but to be fixed at about 280 µm due to the necessity derived from design, Z0 is about 30 Ω and is not matched with 50 Ω when the conductor outer diameter is 150 µm. As shown in FIG. 18, when the conductor outer diameter is changed/adjusted to 100 µm, Z0 can be almost matched with 50 Ω.

Figure 20:
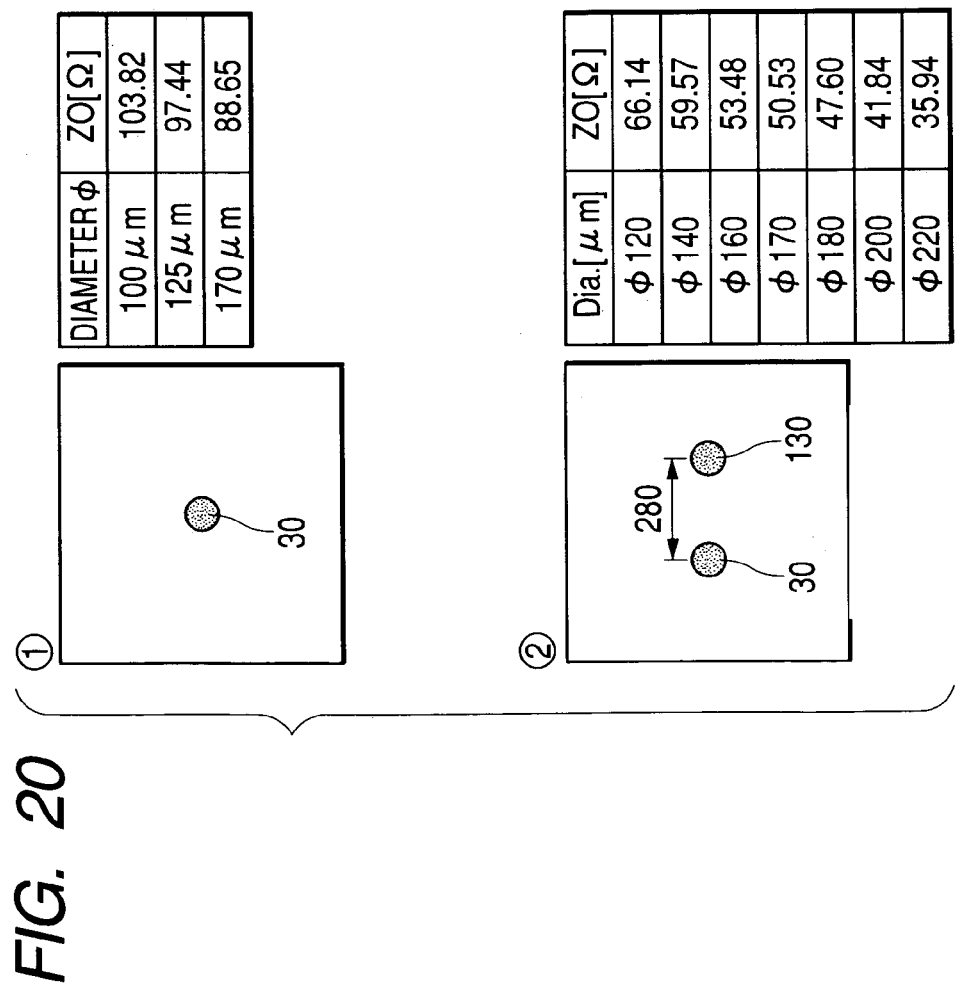
[FIG. 20]

Further, FIG. 20 shows results of the same calculation conducted on board samples (1) to (4) produced in the same manner as in FIG. 17 except that an outer diameter (sectional diameter) of each of a shield through-hole conductor or conductors 130 and a signal through-hole conductor 30 was changed variously while an interaxis distance between the conductors 30 and 130 was fixed at 280 µm. It is proved that in spite of the interaxis distance fixed at 280 µm, Z0 can be almost matched with 50 Ω when the conductor outer diameter is selected appropriately.

This application is based on Japanese Patent application JP 2003-52695, filed Feb. 28, 2003, the entire content of which is hereby incorporated by reference, the same as if set forth at length.

What is claimed is:

1. A wiring board comprising:

a plate core having a first main surface and a second main surface;

conductor layers including a conductor line;

dielectric layers laminated alternately with said conductor layers on at least one of said first and second main surfaces of said plate core;

via conductors formed to penetrate said dielectric layers;

a signal through-hole made to penetrate said plate core in a plate thickness direction;

a signal through-hole conductor with which an inner surface of said signal through-hole is covered;

a first path end pad provided on a first main surface side of said plate core;

a second path end pad formed on a second main surface side of said plate core;

a shield through-hole formed to penetrate said plate core in said plate thickness direction and located in a position adjacent to said signal through-hole in said plate core; and a shield through-hole conductor connected to at least one of a surface conductor on said first main surface side and a surface conductor on said second main surface side in said plate core; wherein:

a signal transmission path is formed to range from said first path end pad to said second path end pad and to include said conductor line, said via conductors, and said signal through-hole conductor;

at least one of said conductor layers is disposed on each of said first and second main surface sides of said plate core so as to form said surface conductor serving as a power supply layer or a ground layer;

said surface conductor on said first main surface side and said conductor line form a strip line, a microstrip line, or a coplanar waveguide with constant characteristic impedance ZO;

an inner surface of said shield through-hole is covered with said shield through-hole conductor in order to shield a high-frequency signal transmitted through said signal through-hole conductor;

an interaxis distance between said signal through-hole conductor and said shield through-hole conductor is adjusted so that characteristic impedance ZO' of a shield transmission path structure formed by said signal through-hole conductor and said shield through-hole conductor is in a range of ZO±20 Ω; and a fourth conductor layer including a third surface conductor, a third dielectric layer, a fifth conductor layer including a fourth surface conductor, and a fourth dielectric layer are laminated successively on said second main surface of said plate core in order of increasing distance from said plate core;

a through-hole opening is formed in said fourth conductor layer and in a position of said third surface conductor corresponding to said signal through-hole conductor, and a through-hole pad electrically connected to said signal through-hole conductor is disposed in an inside of said through-hole opening so as to form an annular gap between said through-hole pad and said through-hole opening;

a via opening is formed in said fifth conductor layer and in a position of said fourth surface conductor corresponding to said signal through-hole conductor, and third signal via conductors formed to penetrate said third dielectric layer and said fourth dielectric layer while connected to said through-hole pad are disposed in an inside of said via opening; and said third surface conductor and said fourth surface conductor form ground conductors or power supply conductors, and a shield via conductor for shielding a high-frequency signal transmitted through said third signal via conductors is provided in said third dielectric layer so as to be connected to at least one of said third surface conductor and said fourth surface conductor.

2. A wiring board comprising:

a plate core having a first main surface and a second main surface;

conductor layers including a conductor line;

dielectric layers laminated alternately with said conductor layers on at least one of said first and second main surfaces of said plate core;

via conductors formed to penetrate said dielectric layers;

a signal through-hole made to penetrate said plate core in a plate thickness direction;

a signal through-hole conductor with which an inner surface of said signal through-hole is covered;

a first path end pad provided on a first main surface side of said plate core;

a second path end pad formed on a second main surface side of said plate core;

a shield through-hole formed to penetrate said plate core in said plate thickness direction and located in a position adjacent to said signal through-hole in said plate core; and a shield through-hole conductor connected to at least one of said surface conductor on said first main surface side and said surface conductor on said second main surface side in said plate core; wherein:

a signal transmission path is formed to range from said first path end pad to said second path end pad and to include said conductor line, said via conductors, and said signal through-hole conductor;

at least one of said conductor layers is disposed on each of said first and second main surface sides of said plate core so as to form a surface conductor serving as a power supply layer or a ground layer;

said surface conductor on said first main surface side and said conductor line form a strip line, a microstrip line, or a coplanar waveguide with constant characteristic impedance ZO;

an inner surface of said shield through-hole is covered with said shield through-hole conductor in order to shield a high-frequency signal transmitted through said signal through-hole conductor;

an outer diameter of each of said signal through-hole conductor and said shield through-hole conductor is adjusted so that characteristic impedance ZO' of a shield transmission path structure formed by said signal through-hole conductor and said shield through-hole conductor is in a range of ZO±20 Ω; and a fourth conductor layer including a third surface conductor, a third dielectric layer, a fifth conductor layer including a fourth surface conductor, and a fourth dielectric layer are laminated successively on said second main surface of said plate core in order of increasing distance from said plate core;

a through-hole opening is formed in said fourth conductor layer and in a position of said third surface conductor corresponding to said signal through-hole conductor, and a through-hole pad electrically connected to said signal through-hole conductor is disposed in an inside of said through-hole opening so as to form an annular gap between said through-hole pad and said through-hole opening;

a via opening is formed in said fifth conductor layer and in a position of said fourth surface: conductor corresponding to said signal through-hole conductor, and third signal via conductors formed to penetrate said third dielectric layer and said fourth dielectric layer while connected to said through-hole pad are disposed in an inside of said via opening; and said third surface conductor and said fourth surface conductor form ground conductors or power supply conductors, and a shield via conductor for shielding a high-frequency signal transmitted through said third signal via conductors is provided in said third dielectric layer so as to be connected to at least one of said third surface conductor and said fourth surface conductor.

3. The wiring board according to claim 1, wherein a plurality of said shield through-hole conductors are disposed around said signal through-hole conductor.

4. The wiring board according to claim 2, wherein a plurality of shield through-hole conductors similar to and in place of said shield through-hole conductor are disposed around said signal through-hole conductor.

5. The wiring board according to claim 1, wherein impedance adjustment openings for adjusting characteristic impedance of said signal transmission path are formed in said surface conductors in positions facing said signal transmission path through said dielectric layers.

6. The wiring board according to claim 2, wherein impedance adjustment openings for adjusting characteristic impedance of said signal transmission path are formed in said surface conductors in positions facing said signal transmission path through said dielectric layers.

7. The wiring board according to claim 5, wherein;

a first conductor layer including a first surface conductor, a first dielectric layer, a second conductor layer including a conductor line, and a second dielectric layer are laminated successively on said first main surface of said plate core in order of increasing distance from said plate core;

said signal through-hole is formed to penetrate said plate core in said plate thickness direction and in a position opposite to a first end portion of said conductor line, and a first main surface side end portion of said signal through-hole conductor with which said inner surface of said signal through-hole is covered is connected to said first end portion of said conductor line through a first signal via conductor formed to penetrate said first dielectric layer, while said second path end pad connected to a second main surface side end portion of said signal through-hole conductor is disposed on said second main surface side of said plate core;

a second signal via conductor formed to penetrate said second dielectric layer is connected to a second end portion of said conductor line, and said first path end pad electrically connected to said second signal via conductor is disposed on said second dielectric layer; and a first impedance adjustment opening for adjusting characteristic impedance of said signal transmission path from said first path end pad to said second path end pad is formed in said first surface conductor and in a position opposite to said second end portion of said conductor line.

8. The wiring board according to claim 6, wherein:

a first conductor, layer including a first surface conductor, a first dielectric layer, a second conductor layer including a conductor line, and a second dielectric layer are laminated successively on said first main surface of said plate core in order of increasing distance from said plate core;

said signal through-hole is formed to penetrate said plate core in said plate thickness direction and in a position opposite to a first end portion of said conductor line, and a first main surface side end portion of said signal through-hole conductor with which said inner surface of said signal through-hole is covered is connected to said first end portion of said conductor line through a first signal via conductor formed to penetrate said first dielectric layer, while said second path end pad connected to a second main surface side end portion of said signal through-hole conductor is disposed on said second main surface side of said plate core;

a second signal via conductor formed to penetrate said second dielectric layer is connected to a second end portion of said conductor line, and said first path end pad electrically connected to said second signal via conductor is disposed on said second dielectric layer; and a first impedance adjustment opening for adjusting characteristic impedance of said signal transmission path from said first path end pad to said second path end pad is formed in said first surface conductor and in a position opposite to said second end portion of said conductor line.

9. The wiring board according to claim 7, wherein an inner diameter d1 of said first impedance adjustment opening is set to be in a range of $d1 \leq d2$ in which said inner diameter of said first impedance adjustment opening is d1 and an outer diameter of said first path end pad is d2.

10. The wiring board according to claim 8, wherein an inner diameter d1 of said first impedance adjustment opening is set to be in a range of $d1 \leq d2$ in which said inner diameter of said first impedance adjustment opening is d1 and an outer diameter of said first path end pad is d2.

11. The wiring board according to claim 5, wherein:

said first conductor layer, said first dielectric layer, said second conductor layer, said second dielectric layer, and a third conductor layer including a second surface conductor are laminated successively on said first main surface of said plate core in order of increasing distance from said plate core;

said conductor line is interposed between said first surface conductor and said second surface conductor so as to form a strip line;

a first path end pad opening is formed in said second surface conductor so as to surround said second signal via conductor, and said first path end pad electrically connected to said second signal via conductor is disposed in an inside of said first path end pad opening so as to form an annular gap between said first path end pad and said first path end pad opening; and a second impedance adjustment opening for adjusting characteristic impedance of said signal transmission path is provided in a position opposite to said first end portion of said conductor line in said second surface conductor.

12. The wiring board according to claim 6, wherein:

said first conductor layer, said first dielectric layer, said second conductor layer, said second dielectric layer, and a third conductor layer including a second surface conductor are laminated successively on said first main surface of said plate core in order of increasing distance from said plate core;

said conductor line is interposed between said first surface conductor and said second surface conductor so as to form a strip line;

a first path end pad opening is formed in said second surface conductor so as to surround said second signal via conductor, and said first path end pad electrically connected to said second signal via conductor is disposed in an inside of said first path end pad opening so as to form an annular gap between said first path end pad and said first path end pad opening; and a second impedance adjustment opening for adjusting characteristic impedance of said signal transmission path is provided in a position opposite to said first end portion of said conductor line in said second surface conductor.

13. The wiring board according to claims 5, wherein:

a fourth conductor layer including a third surface conductor, a third dielectric layer, a fifth conductor layer including a fourth surface conductor, a fourth dielectric layer and a sixth conductor layer including a fifth surface conductor are laminated successively on said second main surface of said plate core in order of increasing distance from said plate core;

a through-hole opening is formed in said fourth conductor layer and in a position of said third surface conductor corresponding to said signal through-hole conductor, and a through-hole pad electrically connected to said signal through-hole conductor is disposed in an inside of said through-hole opening so as to form an annular gap between said through-hole pad and said through-hole opening;

a via opening is formed in said fifth conductor layer and in a position of said fourth surface conductor corresponding to said signal through-hole conductor, and third signal via conductors formed to penetrate said third dielectric layer and said fourth dielectric layer while connected to said through-hole pad are disposed in an inside of said via opening;

a second path end pad opening is formed in said sixth conductor layer and in a position of said fifth surface conductor corresponding to said signal through-hole conductor, and said second path end pad electrically connected to said third signal via conductors is disposed in an inside of said second path end pad opening so as to form an annular gap between said second path end pad and said second path end pad opening; and said through-hole pad, said via opening, said second path end pad and said second path end pad opening are all disposed concentrically, and an inner diameter d4 of said via opening is adjusted to be in a range of $d3 \leq d4 \leq d5$ in which d3 is an outer diameter of said through-hole pad, d4 is said inner diameter of bald via opening, d5 is an inner diameter of said second path end pad opening, so that said via opening serves as an impedance adjustment hole.

14. The wiring board according to claims 6, wherein:

a fourth conductor layer including a third surface conductor, a third dielectric layer, a fifth conductor layer including a fourth surface conductor, a fourth dielectric layer and a sixth conductor layer including a fifth surface conductor are laminated successively on said second main surface of said plate core in order of increasing distance from said plate core;

a through-hole opening is formed in said fourth conductor layer and in a position of said third surface conductor corresponding to said signal through-hole conductor, and a through-hole pad electrically connected to said signal through-hole conductor is disposed in an inside of said through-hole opening so as to form an annular gap between said through-hole pad and said through-hole opening;

a via opening is formed in said fifth conductor layer and in a position of said fourth surface conductor corresponding to said signal through-hole conductor, and third signal via conductors formed to penetrate said third dielectric layer and said fourth dielectric layer while connected to said through-hole pad are disposed in an inside of said via opening;

a second path end pad opening is formed in said sixth conductor layer and in a position of said fifth surface conductor corresponding to said signal through-hole conductor, and 'said second path end pad electrically connected to said third signal via conductors is disposed in an inside of said second path end pad opening so as to form an annular gap between said second path end pad and said second path end pad opening; and said through-hole pad, said via opening, said second path end pad and said second path end pad opening are all disposed concentrically, and an inner diameter d4 of said via opening is adjusted to be in a range of $d3 \leq d4 \leq d5$ in which d3 is an outer diameter of said through-hole pad, d4 is said inner diameter of said via opening, d5 is an inner diameter of said second path end pad opening, so that said via opening serves as an impedance adjustment hole.

15. The wiring board according to claim 13, wherein said inner diameter d4 of said via opening is adjusted to be in a range of $d3 \leq d4 \leq d6$ in which d6 is an outer diameter of said second path end pad.

16. The wiring board according to claim 14, wherein said inner diameter d4 of said via opening is adjusted to be in a range of $d3 \leq d4 \leq d6$ in which d6 is an outer diameter of said second path end pad.

17. The wiring board according to claim 5, wherein said impedance adjustment openings are provided as a combination of a plurality of kinds of openings different in terms of at least one of shape of a signal transmission path side conductor portion of each opening forming parasitic capacitance with a surface conductor portion around said opening, size of said signal transmission path side conductor portion, and relative position relation between said surface conductor portion and said signal transmission path side conductor portion.

18. The wiring board according to claim 6, wherein said impedance adjustment openings are provided as a combination of a plurality of kinds of openings different in terms of at least one of shape of a signal transmission path side conductor portion of each opening forming parasitic capacitance with a surface conductor portion around said opening, size of said signal transmission path side conductor portion, and relative position relation between said surface conductor portion and said signal transmission path side conductor portion.

* * * * *